US011387172B2

(12) United States Patent
Deguchi et al.

(10) Patent No.: US 11,387,172 B2
(45) Date of Patent: Jul. 12, 2022

(54) SEMICONDUCTOR DEVICE AND METHOD FOR MANUFACTURING THE SAME

(71) Applicant: RENESAS ELECTRONICS CORPORATION, Tokyo (JP)

(72) Inventors: Yoshinori Deguchi, Tokyo (JP); Iwao Natori, Tokyo (JP); Seiya Isozaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/281,619

(22) Filed: Feb. 21, 2019

(65) Prior Publication Data

US 2019/0295930 A1 Sep. 26, 2019

(30) Foreign Application Priority Data

Mar. 23, 2018 (JP) ............................ JP2018-057207

(51) Int. Cl.
*H01L 23/495* (2006.01)
*H01L 23/532* (2006.01)
(Continued)

(52) U.S. Cl.
CPC ........ *H01L 23/49503* (2013.01); *H01L 22/32* (2013.01); *H01L 23/53257* (2013.01);
(Continued)

(58) Field of Classification Search
CPC ............... H01L 23/49503; H01L 22/32; H01L 23/49541; H01L 23/53214;
(Continued)

(56) References Cited

U.S. PATENT DOCUMENTS 8,063,489 B2 11/2011 Shigihara et al.
9,111,951 B2 8/2015 Uemura et al.
(Continued)

FOREIGN PATENT DOCUMENTS

CN 105990295 A 10/2016
JP 09-022912 A 1/1997
(Continued)

OTHER PUBLICATIONS

Extended European Search Report issued in corresponding European Patent Application No. 19164226.3-1212, dated Jul. 16, 2019.
(Continued)

*Primary Examiner* — Yasser A Abdelaziez
(74) *Attorney, Agent, or Firm* — McDermott Will & Emery LLP

(57) ABSTRACT

A pad is formed on an interlayer insulating film, art insulating film is formed on the interlayer insulating film to cover the pad, and an opening portion exposing a part of the pad is formed in the insulating film. A metal film electrically connected to the pad is formed on the pad exposed from the opening portion and on the insulating film. The metal film integrally includes a first portion on the pad exposed from the opening portion and a second portion on the insulating film. An upper surface of the metal film has a wire bonding region for bonding a wire to the metal film and a probe contact region for bringing the probe into contact with the metal film, the wire bonding region is located on the first portion of the metal film, and the probe contact region is located on the second portion of the metal film.

18 Claims, 20 Drawing Sheets

(51) Int. Cl.
*H01L 23/00* (2006.01)
*H01L 21/66* (2006.01)
*H01L 23/31* (2006.01)

(52) U.S. Cl.
CPC .............. *H01L 24/03* (2013.01); *H01L 24/05* (2013.01); *H01L 23/3192* (2013.01); *H01L 24/32* (2013.01); *H01L 24/45* (2013.01); *H01L 24/48* (2013.01); *H01L 24/73* (2013.01); *H01L 24/92* (2013.01); *H01L 2224/0345* (2013.01); *H01L 2224/0362* (2013.01); *H01L 2224/0392* (2013.01); *H01L 2224/03462* (2013.01); *H01L 2224/03464* (2013.01); *H01L 2224/04042* (2013.01); *H01L 2224/0508* (2013.01); *H01L 2224/0558* (2013.01); *H01L 2224/05073* (2013.01); *H01L 2224/05082* (2013.01); *H01L 2224/05083* (2013.01); *H01L 2224/05124* (2013.01); *H01L 2224/05166* (2013.01); *H01L 2224/05181* (2013.01); *H01L 2224/05184* (2013.01); *H01L 2224/05186* (2013.01); *H01L 2224/05558* (2013.01); *H01L 2224/05572* (2013.01); *H01L 2224/05573* (2013.01); *H01L 2224/05582* (2013.01); *H01L 2224/05583* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05681* (2013.01); *H01L 2224/05684* (2013.01); *H01L 2224/05686* (2013.01); *H01L 2224/06135* (2013.01); *H01L 2224/32225* (2013.01); *H01L 2224/32245* (2013.01); *H01L 2224/45144* (2013.01); *H01L 2224/45147* (2013.01); *H01L 2224/48091* (2013.01); *H01L 2224/48227* (2013.01); *H01L 2224/48247* (2013.01); *H01L 2224/73265* (2013.01); *H01L 2224/92247* (2013.01); *H01L 2224/94* (2013.01); *H01L 2924/10253* (2013.01); *H01L 2924/1434* (2013.01); *H01L 2924/15311* (2013.01); *H01L 2924/3512* (2013.01); *H01L 2924/37001* (2013.01)

(58) Field of Classification Search
CPC ......... H01L 23/53242; H01L 23/53257; H01L 24/03; H01L 24/05; H01L 24/94; H01L 2224/00582; H01L 2224/45144; H01L 2224/05073; H01L 2224/05083; H01L 2924/37001; H01L 2224/05124; H01L 2924/1434; H01L 2224/05644; H01L 2224/05681; H01L 24/32; H01L 2924/3512; H01L 2224/05655; H01L 2224/48247; H01L 2224/06135; H01L 2224/03464; H01L 2224/05647; H01L 2224/05686; H01L 2224/94; H01L 24/73; H01L 2224/05184; H01L 2224/05572; H01L 2224/0345; H01L 2924/10253; H01L 2224/05583; H01L 2224/05664; H01L 2924/15311; H01L 2224/05186; H01L 2224/05573; H01L 24/92; H01L 2224/05181; H01L 2224/0508; H01L 24/45; H01L 2224/0392; H01L 2224/0558; H01L 24/48; H01L 2224/32225; H01L 2224/03462; H01L 23/3192; H01L 2224/48091; H01L 2224/05082; H01L 2224/05666; H01L 2224/32245; H01L 2224/92247; H01L 2224/04042; H01L 2224/05166; H01L 2224/73265; H01L 2224/48227; H01L 2224/0362; H01L 2224/05684; H01L 24/42; H01L 23/4952; H01L 23/49513; H01L 23/3107
See application file for complete search history.

(56) References Cited

U.S. PATENT DOCUMENTS

| | | | | |
|---|---|---|---|---|
| 9,391,035 | B2 | 7/2016 | Tomita et al. | |
| 9,406,628 | B2 | 8/2016 | Matsumoto et al. | |
| 2003/0173667 | A1* | 9/2003 | Yong | H01L 24/05 257/E23.02 |
| 2003/0173668 | A1* | 9/2003 | Downey | H01L 24/03 257/750 |
| 2004/0094836 | A1* | 5/2004 | Seshan | H01L 24/05 257/735 |
| 2005/0093176 | A1* | 5/2005 | Hung | H01L 24/48 257/786 |
| 2005/0173801 | A1* | 8/2005 | Mimura | H01L 24/05 257/758 |
| 2006/0065969 | A1* | 3/2006 | Antol | H01L 24/48 257/700 |
| 2007/0164279 | A1* | 7/2007 | Lin | H01L 24/05 257/48 |
| 2007/0212867 | A1* | 9/2007 | Chen | H01L 24/05 438/613 |
| 2008/0182120 | A1* | 7/2008 | Tan | H01L 24/05 428/603 |
| 2008/0203577 | A1* | 8/2008 | Fukamizu | H01L 24/06 257/773 |
| 2010/0133688 | A1* | 6/2010 | Shigihara | H01L 24/48 257/738 |
| 2011/0101545 | A1* | 5/2011 | Yeo | H01L 24/06 257/786 |
| 2012/0091518 | A1* | 4/2012 | Sukekawa | H01L 27/10855 257/296 |
| 2013/0256906 | A1* | 10/2013 | Mori | H01L 22/32 257/774 |
| 2015/0171035 | A1* | 6/2015 | Tran | H01L 24/48 438/612 |
| 2016/0013142 | A1 | 1/2016 | Maeda et al. | |
| 2017/0062321 | A1* | 3/2017 | Choi | H01L 24/03 |
| 2018/0374795 | A1* | 12/2018 | Deguchi | H01L 23/5384 |

FOREIGN PATENT DOCUMENTS

| | | | |
|---|---|---|---|
| JP | 2003-037126 | A | 2/2003 |
| JP | 2010-157683 | A | 7/2010 |
| JP | 2014-154640 | A | 8/2014 |
| JP | 2014-187073 | A | 10/2014 |
| JP | 2015-204364 | A | 11/2015 |

OTHER PUBLICATIONS

Japanese Office Action issued in corresponding Japanese Patent Application No. 2018-057207, dated Jul. 6, 2021, with English translation.
European Office Action issued in corresponding European Patent Application No. 19164226.3-1212, dated Dec. 1, 2021.
Japanese Reasons for Refusal issued in corresponding Japanese Patent Application No. 2018-057207, dated Mar. 1, 2022, with English translation.

* cited by examiner

FIG. 29

| STYLUS PRESSURE (gf) \ NUMBER OF CONTACTS | 12 | 14 | 16 | 18 | 20 | 30 | 40 | 70 | 100 |
|---|---|---|---|---|---|---|---|---|---|
| 6 | | | ○ | ○ | ○ | ○ | ○ | | |
| 7 | | | ○ | ○ | ○ | ○ | ○ | | |
| 8 | | | ○ | ○ | ○ | ○ | ○ | | |
| 9 | | | ○ | ○ | ○ | ○ | ○ | | |

FIG. 30

| STYLUS PRESSURE (gf) \ NUMBER OF CONTACTS | 12 | 14 | 16 | 18 | 20 | 30 | 40 | 70 | 100 |
|---|---|---|---|---|---|---|---|---|---|
| 6 | ○ | ○ | ○ | ○ | ○ | × | × | × | × |
| 7 | ○ | × | × | × | × | × | × | × | × |
| 8 | ○ | × | × | × | × | × | × | × | × |
| 9 | × | × | × | × | × | × | × | × | × |

SEMICONDUCTOR DEVICE AND METHOD FOR MANUFACTURING THE SAME

CROSS-REFERENCE TO RELATED APPLICATION

The present application claims priority from Japanese Patent Application No. 2018-057207, filed on Mar. 23, 2018, the content of which is hereby incorporated by reference into this application.

TECHNICAL FIELD OF THE INVENTION

The present invention relates to a semiconductor device and a method for manufacturing the same, and for example, can be suitably used for a semiconductor device to which wires are connected, and for a method for manufacturing the semiconductor device.

BACKGROUND OF THE INVENTION

Wires are electrically connected to pads of a semiconductor chip.

Japanese Unexamined Patent Publication No. 2014-187073 (Patent Document 1) describes a technology relating to a semiconductor device having a bonding pad with an OPM structure.

Japanese Unexamined Patent Publication No. 2014-154640 (Patent Document 2) describes a technology relating to a semiconductor device having a bonding pad.

Japanese Unexamined Patent Publication No. H9-22912 (Patent Document 3) describes a technology relating to a semiconductor device having a bump electrode.

SUMMARY OF THE INVENTION

In a semiconductor device to which wires are connected, it is desired that reliability thereof be enhanced.

Other problems and novel features will be apparent from the description in the specification and the accompanying drawings.

In accordance with one embodiment, a semiconductor device includes: a pad formed on a first insulating film; a second insulating film formed on the first insulating film so as to cover the pad; an opening portion that exposes apart of the pad, the opening portion being formed in the second insulating film; and a metal film formed on the pad exposed from the opening portion and on the second insulating film and electrically connected to the pad. The metal film integrally has a first portion located on the pad exposed from the opening portion and a second portion located on the second insulating film. An upper surface of the metal film has a first region for bonding a wire to the metal film and a second region for bringing a probe into contact with the metal film, the first region is located in the first portion of the metal film, and the second region is located in the second portion of the metal film.

In accordance with one embodiment, the reliability of the semiconductor device can be enhanced.

BRIEF DESCRIPTIONS OF THE DRAWINGS

FIG. 29 is a table showing results of investigating damage caused by the probe inspection;

FIG. 30 is a table showing results of investigating the damage caused by the probe inspection;

DESCRIPTIONS OF THE PREFERRED EMBODIMENTS

Figure 1:
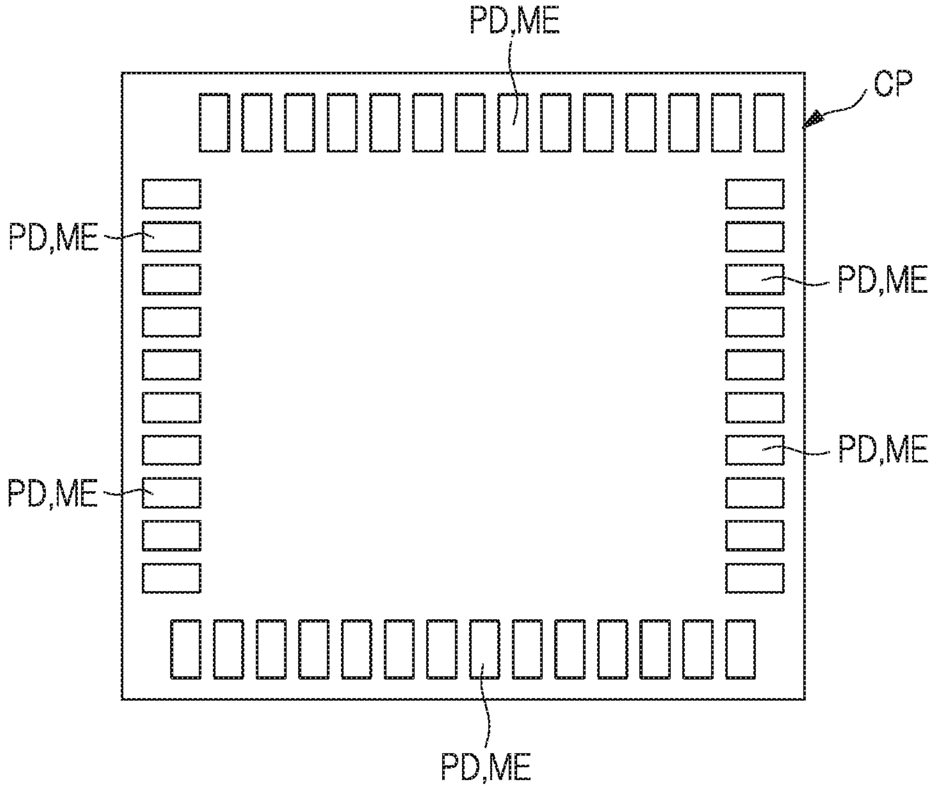
FIG. 1 is an overall plan view of a semiconductor device according to one embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

Embodiment

<Overall Structure of Semiconductor Chip>

A semiconductor device according to this embodiment will be described with reference to the drawings.

FIG. 1 is an overall plan view of a semiconductor device (semiconductor chip) CP according to this embodiment, and FIG. 1 shows an overall plan view of an upper surface of the semiconductor device CP.

The semiconductor device (semiconductor chip) CP according to this embodiment has an upper surface that is a main surface on one side, and a back surface (lower surface) that is a main surface on an opposite side with the upper surface. FIG. 1 shows the upper surface of the semiconductor device CP. Note that, in the semiconductor device CP, the main surface on a side on which pads PD are formed will be referred to as the upper surface, and the main surface on an opposite side with the main surface on the side on which the pads PD are formed (that is, the upper surface) will be referred to as the back surface of the semiconductor device CP.

As shown in FIG. 1, the semiconductor device CP includes a plurality of the pads (pad electrodes, electrodes pads, bonding pads) PD on the upper surface side. The pads PD function as externally connecting terminals of the semiconductor device CP. The pads PD are pads for wire bonding. Moreover, though details will be described later, metal films ME are formed on the respective pads PD. When the upper surface of the semiconductor device CP is viewed from above, the metal films ME are observed; however, the pads PD are hidden under the metal films ME. When manufacturing a semiconductor package using the semiconductor device CP, wires (corresponding to wires BW to be described later) are bonded to the metal films ME on the pads PD, and the wires and the pads PD are electrically connected via the metal films ME.

A planar shape of the semiconductor device CP is a quadrangle, and more specifically a rectangle. Corners of the rectangle may be rounded. In the case of FIG. 1, on the upper surface of the semiconductor device CP, a plurality of pairs of the pads PD and the metal films ME formed on the pads PD are arrayed along an outer periphery of the upper surface of the semiconductor device CP. In the case of FIG. 1, the plurality of pairs of the pads PD and the metal films ME formed on the pads PD are formed along four sides on the upper surface of the semiconductor device CP; however, without being limited to this, sometimes may possibly be disposed (arrayed) along three sides, two sides or one side. Moreover, in the case of FIG. 1, the pairs of the pads PD and the metal films ME formed on the pads PD are arrayed in one line; however, without being limited to this, for example, can also be arrayed in two lines, and further, can be arrayed in a so-called staggered pattern. Moreover, the number of pairs of the pads PD provided in the semiconductor device CP and the metal films ME formed on the pads PD is changeable according to needs.

<Semiconductor Package Structure>

Figure 2:
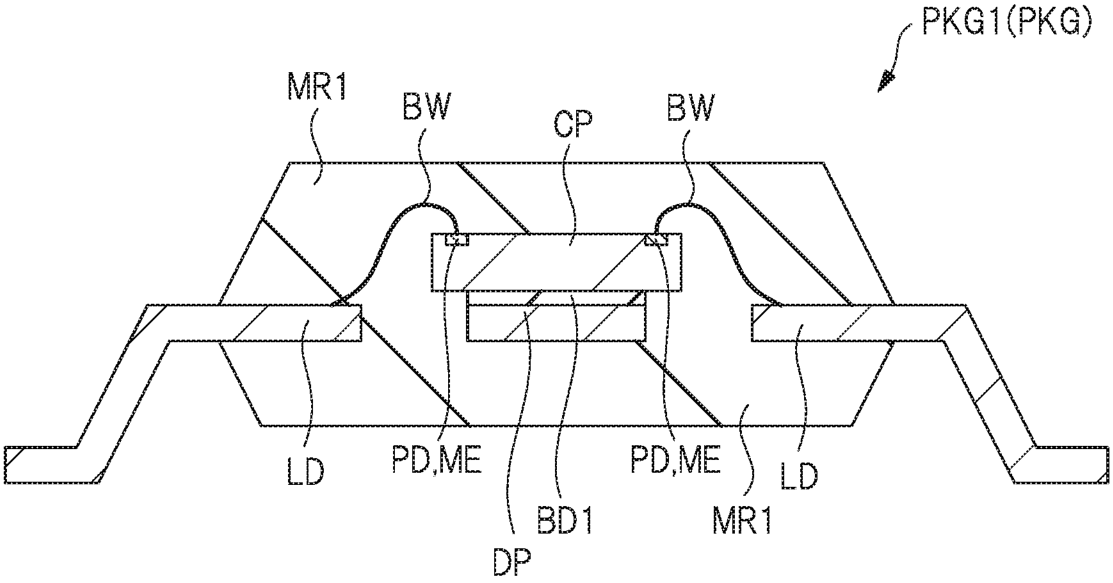
FIG. 2 is a cross-sectional view showing an example of a semiconductor device (semiconductor package) in which the semiconductor device (semiconductor chip) in FIG. 1 is packaged.
Figure 3:
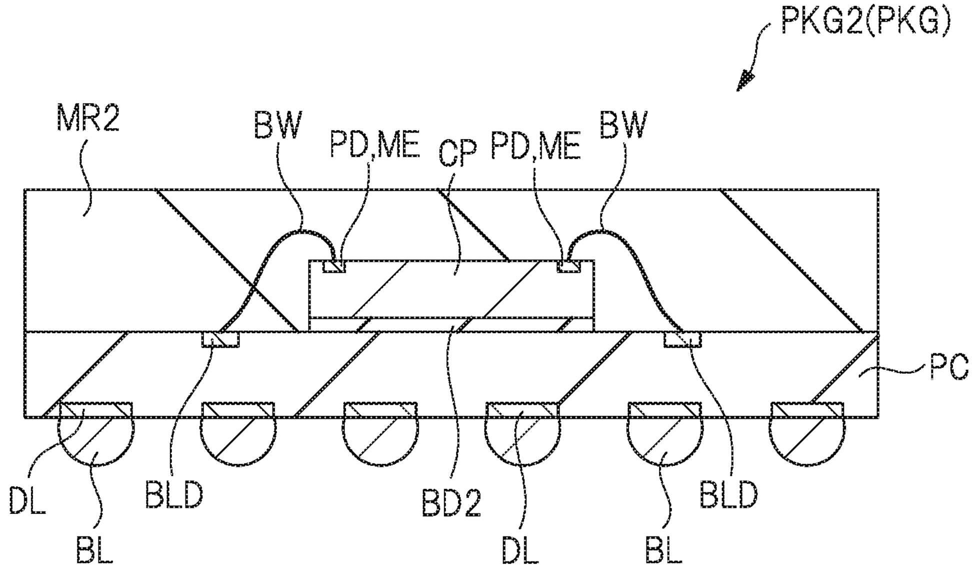
FIG. 3 is a cross-sectional view showing another example of the semiconductor device (semiconductor package) in which the semiconductor device (semiconductor chip) in FIG. 1 is packaged.

FIG. 2 is a cross-sectional view schematically showing an example of a semiconductor device (semiconductor package) PKG in which the semiconductor device (semiconductor chip) CP according to this embodiment is packaged, and FIG. 3 is a cross-sectional view showing another example thereof. Note that the semiconductor device PKG shown in FIG. 2 will be referred to as a semiconductor device PKG1 by being added with reference symbol PKG1, and the semiconductor device PKG shown in FIG. 3 will be referred to as a semiconductor device PKG2 by being added with reference symbol PKG2.

The semiconductor device (semiconductor package) PKG1 shown in FIG. 2 is a semiconductor package manufactured using a lead frame. The semiconductor device PKG 1 includes: the semiconductor device (semiconductor chip)

CP; a die pad (chip mounting portion) DP that supports or mounts the semiconductor chip CP; a plurality of leads LD; a plurality of wires (bonding wires) BW which electrically connect the plurality of leads LD and the plurality of pads PD on the upper surface of the semiconductor device CP individually to each other; and a sealing portion MR1 that seals these.

The sealing portion (sealing resin portion) MR1 is a sealing resin portion, and for example, is made of a resin material such as a thermosetting resin material, and may also contain filler and the like. By the sealing portion MR1, the semiconductor device CP, the plurality of leads LD and the plurality of wires BW are sealed, and are electrically and mechanically protected.

The semiconductor device CP is mounted (disposed) on an upper surface of the die pad DP so that the upper surface of the semiconductor device CP faces upward, and the back surface of the semiconductor device CP is bonded and fixed to the upper surface of the die pad DP with a bonding material (die bonding material, adhesive) BD1 interposed therebetween. Moreover, the semiconductor device CP is sealed in the sealing portion MR1, and is not exposed from the sealing portion MR1.

The leads (lead portions) LD are made of a conductor, and preferably, are made of a metal material such as copper (Cu) and a copper alloy. The respective leads LD are composed of inner lead portions which are portions located in the sealing portion MR1 among the leads LD, and of outer lead portions which are portions located outside of the sealing portion MR1 among the leads LD. The outer lead portions protrude from side surfaces of the sealing portion MR1 to the outside of the sealing portion MR1.

The outer lead portions of the respective leads LD are subjected to a bending process so that lower surfaces near end portions of the outer lead portions are located a little below a lower surface of the sealing portion MR1. The outer lead portions of the leads LD function as external terminals of the semiconductor device PKG1.

The respective pads PD on the upper surface of the semiconductor device CP are electrically connected to the inner lead portions of the respective leads LD through the wires (bonding wires) BW which are conductive connection members. That is, between both ends of each wire BW, one end portion is connected to each pad PD of the semiconductor device CP, and the other end portion is connected to an upper surface of the inner lead portion of each lead LD. However, though details will be described later, the metal film ME is formed on the pad PD, and the end portion of the wire BW, which is connected to the pad PD, is actually bonded (connected) to the metal film ME on the pad PD. The wire BW has conductivity, and specifically, is a metal wire (thin metal wire) such as a copper (Cu) wire and a gold (Au) wire. The wire BW is sealed in the sealing portion MR1, and is not exposed from the sealing portion MR1.

Note that the description has been given here of the case where the semiconductor device PKG1 is a quad flat package (QFP)-type semiconductor package. However, the semiconductor device PKG1 is not limited to this, and is changeable in various ways. For example, the semiconductor device PKG1 may adopt another package configuration such as a quad flat non-leaded package (QFN) configuration and a small out-line package (SOP) configuration.

The semiconductor device (semiconductor package) PKG2 shown in FIG. 3 is a semiconductor package manufactured using a wiring board. The semiconductor device PKG2 includes: a semiconductor device (semiconductor chip) CP; a wiring board PC that mounts (supports) the semiconductor device CP; a plurality of wires BW which electrically connect a plurality of pads PD on an upper surface of the semiconductor device CP and a plurality of connection terminals BLD of the wiring board PC corresponding to the pads PD; and a sealing portion MR2 that covers an upper surface of the wiring board PC including the semiconductor device CP and the wires BW. The semiconductor device PKG2 further includes a plurality of solder balls BL provided as external terminals on a lower surface of the wiring board PC in an area array arrangement.

The wiring board PC has an upper surface and a lower surface, which are main surfaces opposite with each other. The semiconductor device CP is mounted (disposed) on the upper surface of the wiring board PC so that the upper surface of the semiconductor device CP faces upward, and a back surface of the semiconductor device CP is bonded and fixed to the upper surface of the wiring board PC with a bonding material (die bonding material, adhesive) BD2 interposed therebetween. The semiconductor device CP is sealed in the sealing portion MR2, and is not exposed from the sealing portion MR2.

A plurality of connection terminals (bonding leads) BLD are provided on the upper surface of the wiring board PC, and a plurality of conductive lands DL are provided on the lower surface of the wiring board PC. The plurality of connection terminals BLD on the upper surface of the wiring board PC are electrically connected individually to the plurality of conductive lands DL on the lower surface of the wiring board PC through wirings of the wiring board PC. The wirings of the wiring board PC include wirings on the upper surface of the wiring board PC, via wirings of the wiring board PC, internal wirings of the wiring board PC, and wirings on the lower surface of the wiring board PC. The solder balls BL are connected (formed) as bump electrodes to the respective conductive lands DL. Therefore, the plurality of solder balls BL are arranged in an array form on the lower surface of the wiring board PC, and the plurality of solder balls BL can function as external terminals of the semiconductor device PKG2.

The respective pads PD on the upper surface of the semiconductor device CP are electrically connected to the respective connection terminals BLD on the upper surface of the wiring board PC through the wires (bonding wires) BW which are conductive connection members. That is, between both ends of each wire BW, one end portion is connected to each pad PD of the semiconductor device CP, and the other end portion is connected to each connection terminal BLD. However, though details will be described later, the metal film ME is formed on the pad PD, and the end portion of the wire BW, which is connected to the pad PD, is actually bonded (connected) to the metal film ME on the pad PD. The wire BW is sealed in the sealing portion MR2, and is not exposed from the sealing portion MR2.

Similarly to the sealing portion MR1 described above, the sealing portion (sealing resin portion) MR2 is a sealing resin portion, and for example, is made of a resin material such as a thermosetting resin material, and may also contain filler and the like. By the sealing portion MR2, the semiconductor device CP and the plurality of wires BW are sealed, and are electrically and mechanically protected.

Note that the description has been given here of the case where the semiconductor device PKG2 is a ball grid array (BGA)-type semiconductor package. However, the semiconductor device PKG2 is not limited to this, is changeable in various ways, and for example, may adopt another package configuration such as a land grid array (LGA) configuration.

Figure 4:
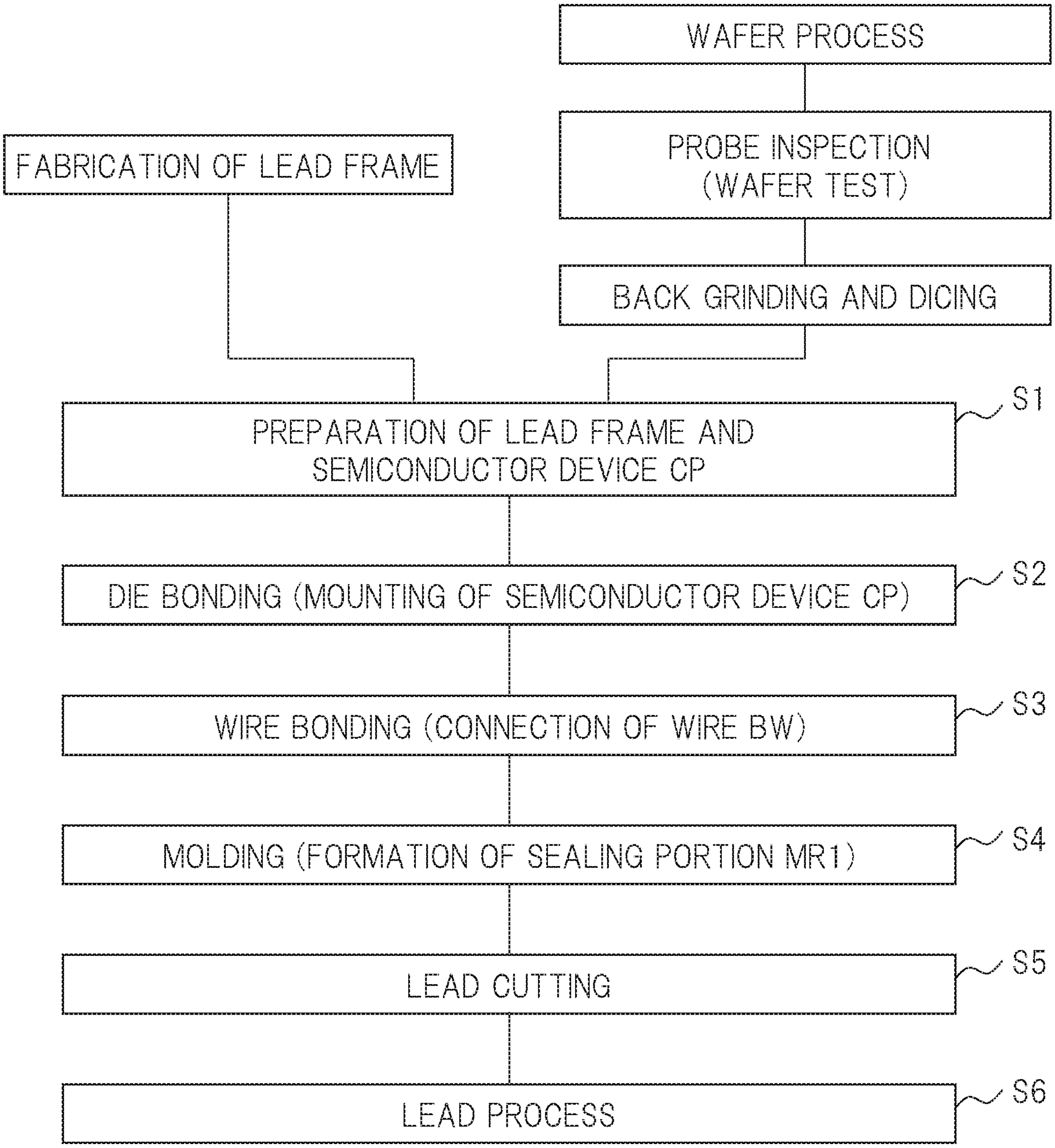
FIG. 4 is a process flowchart showing a manufacturing process of the semiconductor device shown in FIG. 2.
Figure 5:
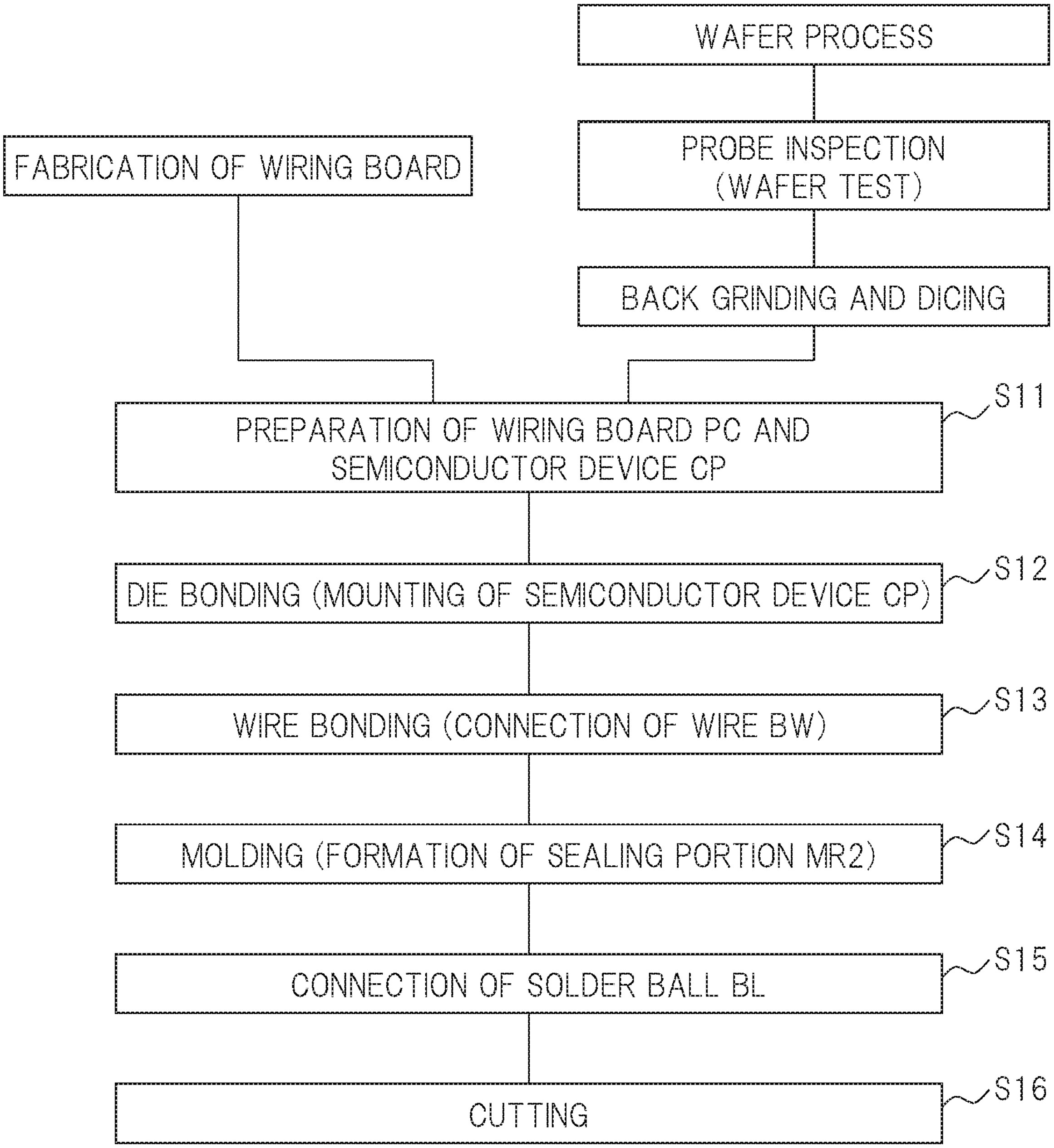
FIG. 5 is a process flowchart showing a manufacturing process of the semiconductor device shown in FIG. 3.

Next a description will be given of a manufacturing process of the semiconductor device PKG1 shown in FIG. 2 and a manufacturing process of the semiconductor device PKG2 shown in FIG. 3. FIG. 4 is a process flowchart showing the manufacturing process of the semiconductor device PKG1 shown in FIG. 2, and FIG. 5 is a process flowchart showing the manufacturing process of the semiconductor device PKG2 shown in FIG. 3.

First, the manufacturing process of the semiconductor device PKG1 shown in FIG. 2 will be described with reference to FIG. 2 and FIG. 4.

In order to manufacture the semiconductor device PKG1, first, the lead frame and the semiconductor device (semiconductor chip) CP are prepared (Step S1 in FIG. 4). The lead frame integrally includes a framework, the plurality of leads LD coupled to the framework, and the die pad DP coupled to the framework with a plurality of suspension leads interposed therebetween. In Step S1, the semiconductor device CP may be prepared after the lead frame is prepared beforehand, or the lead frame may be prepared after the semiconductor device CP is prepared beforehand, or the lead frame and the semiconductor device CP may be prepared simultaneously.

Note that, as shown in FIG. 4, the lead frame can be prepared by fabricating (manufacturing) the lead frame, and moreover, the semiconductor device CP can be prepared by manufacturing the semiconductor device CP. The manufacturing process of the semiconductor device CP is performed by a wafer process, a subsequent probe inspection (wafer test) step and subsequent back-grinding step and dicing step. Details of the manufacturing process will be described later with reference to FIGS. 11 to 22 to be mentioned later. Note that, though the dicing step is performed after the back-grinding step, the dicing step may possibly be performed without performing the back-grinding step.

Next, a die bonding step is performed, and the semiconductor device CP is mounted and bonded on the die pad DP of the lead frame with the bonding material BD1 interposed therebetween (Step S2 in FIG. 4).

Next, a wire bonding step is performed, and the plurality of pads PD of the semiconductor device CP and (the inner lead portions of) the plurality of leads LD of the lead frame are electrically connected to each other through the plurality of wires BW (Step S3 in FIG. 4). One end portion of each wire BW is connected to the metal film ME on each pad PD of the semiconductor device CP, and the other end portion is connected to an upper surface of the inner lead portion of each lead LD. In the case of the wire bonding, the semiconductor device CP is heated to a predetermined temperature.

Next, resin sealing by a molding step (resin molding step) is performed, and the semiconductor device CP and the plurality of wires BW connected thereto are sealed by the sealing portion (sealing resin portion) MR1 (Step S4 in FIG. 4). By the molding step of this Step S4, the sealing portion MR1 that seals the semiconductor device CP, the die pad DP, the inner lead portions of the plurality of leads LD and the plurality of wires BW and suspension leads is formed.

Next, a plating treatment is implemented for the outer lead portions of the leads LD exposed from the sealing portion MR1 according to needs, and then, the leads LD and the suspension leads are cut at predetermined positions outside the sealing portion MR1, and are separated from the framework of the lead frame (Step S5 in FIG. 4).

Next, a bending process (lead process, lead forming) is implemented for the outer lead portions of the leads LD protruding from the sealing portion MR1 (Step S6 in FIG. 4).

In this way, the semiconductor device PKG1 shown in FIG. 2 is manufactured.

Next, a manufacturing process of the semiconductor device PKG2 shown in FIG. 3 will be described with reference to FIG. 3 and FIG. 5.

In order to manufacture the semiconductor device PKG2, first, the wiring board PC and the semiconductor device (semiconductor chip) CP are prepared (Step S11 in FIG. 5). At this stage, a plurality of the wiring boards PC may be integrally connected to one another in an array form. In Step S11, the semiconductor device CP may be prepared after the lead frame is prepared beforehand, or the wiring board PC may be prepared after the semiconductor device CP is prepared beforehand, or the wiring board PC and the semiconductor device CP may be prepared simultaneously.

Next, a die bonding step is performed, and the semiconductor device (semiconductor chip) CP is mounted and bonded on the wiring board PC with the bonding material BD2 interposed therebetween (Step S12 in FIG. 5).

Next, a wire bonding step is performed, and the plurality of pads PD of the semiconductor device CP and the plurality of connection terminals BLD of the wiring board PC on which the semiconductor device CP is mounted are electrically connected to each other through the plurality of wires BW (Step S13 in FIG. 5). One end portion of each wire BW is connected to the metal film ME on each pad PD of the semiconductor device CP, and the other end portion is connected to each connection terminal BLD. In the case of the wire bonding, the semiconductor device CP is heated to a predetermined temperature.

Next, resin sealing by a molding step (resin molding step) is performed to form the sealing portion (sealing resin portion) MR2 on the upper surface of the wiring board PC so as to cover the semiconductor device CP and the wires BW, and the semiconductor device CP and the wires BW are sealed by the sealing portion MR2 (Step S14 in FIG. 5).

Next, the solder balls BL are connected to the respective conductive lands DL on the lower surface of the wiring board PC (Step S15 in FIG. 5).

Thereafter, when the plurality of wiring boards PC are connected integrally with one another in an array form, a wiring board base in which the plurality of wiring boards PC is connected integrally with one another in an array form is cut (dicing), thereby being divided into the individual wiring boards PC (Step S16 in FIG. 5). At this time, the sealing portion MR2 may also possibly be cut together with the wiring board base.

In this way, the semiconductor device PKG2 shown in FIG. 3 is manufactured.

<Internal Structure of Semiconductor Chip>

Figure 6:
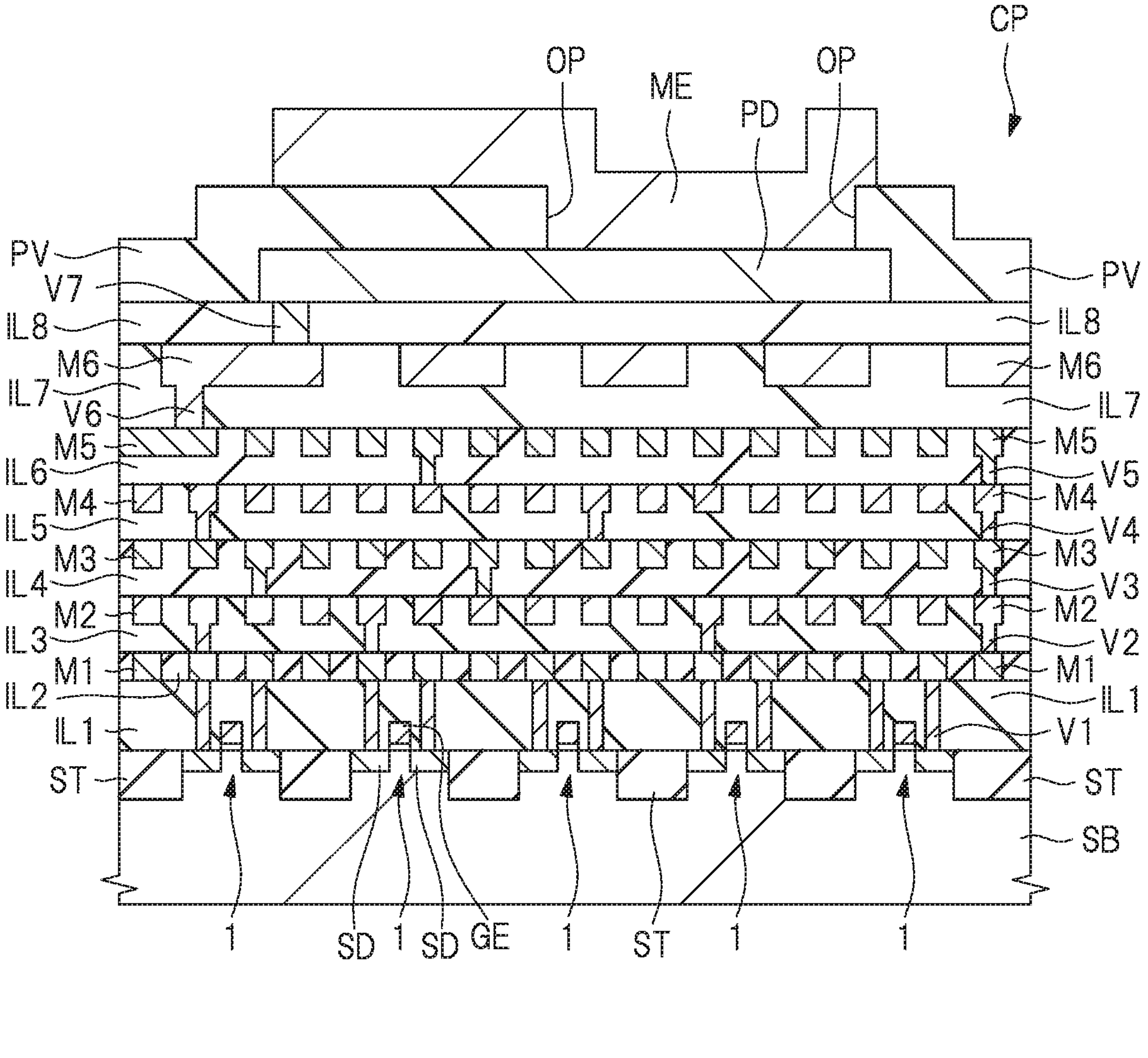
FIG. 6 is a cross-sectional view showing a principal part of the semiconductor device according to one embodiment.
Figure 7:
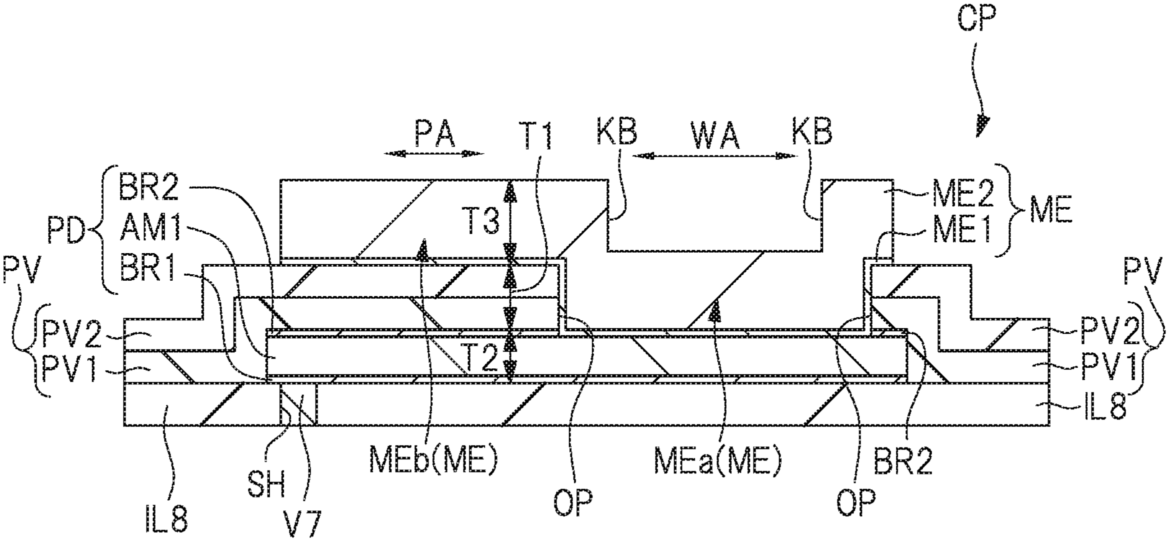
FIG. 7 is a cross-sectional view showing a principal part of the semiconductor device according to one embodiment.

FIG. 6 is a cross-sectional view showing a principal part of the semiconductor device (semiconductor chip) CP according to this embodiment. Moreover, FIG. 7 is also a cross-sectional view showing a principal part of the semiconductor device CP according to this embodiment, and the same cross section as that in FIG. 6 is shown. In FIG. 7, illustration of a structure below an interlayer insulating film IL8 is omitted.

In the semiconductor device CP according to this embodiment, a semiconductor element such as a metal insulator semiconductor field effect transistor (MISFET) is formed on a main surface of a semiconductor substrate SB, and a multilayer wiring structure including a plurality of wiring layers is formed on the semiconductor substrate SB. Hereinafter, a specific description will be given of a configuration example of the semiconductor device according to this embodiment.

As shown in FIG. 6, the semiconductor element such as a MISFET is formed on the semiconductor substrate SB that constitutes the semiconductor device according to this embodiment and is made of single crystal silicon.

In the main surface of the semiconductor substrate SB, an element isolation region ST is formed by a shallow trench isolation (STI) method and the like, and in the semiconductor substrate SB, a MISFET 1 is formed in an active region defined by this element isolation region ST. The element isolation region ST is composed of an insulating film embedded in a trench formed in the semiconductor substrate SB.

The MISFET 1 includes: a gate electrode GE formed on the main surface of the semiconductor substrate SB with a gate insulating film interposed therebetween; and a source/drain region (semiconductor region for source or drain) SD formed in the semiconductor substrate SB on each of both sides of the gate electrode GE. A lightly doped drain (LDD) structure can also be adopted for the source/drain region SD, and in that case, a sidewall insulating film (not shown) also referred to as a sidewall spacer is formed on a sidewall of the gate electrode GE. As the MISFET 1, it is possible to form an n-channel MISFET or a p-channel MISFET or both of the n-channel MISFET and the p-channel MISFET. Note that the source/drain region SD of the n-channel MISFET is formed in a p-type well (not shown) of the semiconductor substrate SB, and the source/drain region SD of the p-channel MISFET is formed in an n-type well (not shown) of the semiconductor substrate SB.

Note that, here, the description is made by taking the MISFET as an example of the semiconductor element formed on the semiconductor substrate SB; however, besides the above, a capacitor element, a resistor element, a memory element, a transistor with another configuration, and the like may be formed.

Moreover, here, the description is made by taking the single crystal silicon substrate as an example of the semiconductor substrate SB; however, as another mode, a silicon on insulator (SOI) substrate or the like can also be used as the semiconductor substrate SB.

On the semiconductor substrate SB, a wiring structure (multilayer wiring structure) including a plurality of insulating films (interlayer insulating films) and a plurality of wiring layers is formed.

That is, on the semiconductor substrate SB, a plurality of interlayer insulating films (insulating films) IL1, IL2, IL3, IL4, IL5, IL 6 and IL7 are formed, and in the plurality of interlayer insulating films IL1, IL2, IL3, IL4, IL5, IL 6 and IL7, plugs V1, via portions V2, V3, V4, V5 and V6 and wirings M1, M2, M3, M4, M5 and M6 are formed. Thereafter, the interlayer insulating film IL8 is formed on the interlayer insulating film IL7, and each pad PD is formed on this interlayer insulating film IL8. Note that wiring (not shown) in the same layer as the pad PD can also be formed on the interlayer insulating film IL8.

Specifically, the interlayer insulating film IL1 is formed on the semiconductor substrate SB so as to cover the above-described MISFET 1, the conductive plugs V1 are embedded in this interlayer insulating film IL1, the interlayer insulating film IL2 is formed on the interlayer insulating film IL1 in which the plugs V1 are embedded, and the wiring M1 is embedded in this interlayer insulating film IL2. Thereafter, the interlayer insulating film IL3 is formed on the interlayer insulating film IL2 in which the wiring M1 is embedded, the wiring M2 is embedded in this interlayer insulating film IL3, the interlayer insulating film IL4 is formed on the interlayer insulating film IL3 in which the wiring M2 is embedded, and the wiring M3 is embedded in this interlayer insulating film IL4. Thereafter, the interlayer insulating film IL5 is formed on the interlayer insulating film IL4 in which the wiring M3 is embedded, the wring M4 is embedded in this interlayer insulating film IL5, the interlayer insulating film IL6 is formed on the interlayer insulating film IL5 in which the wiring M4 is embedded, and the wiring M5 is embedded in this interlayer insulating film IL6. Thereafter, the interlayer insulating film IL7 is formed on the interlayer insulating film IL6 in which the wiring M5 is embedded, the wring M6 is embedded in this interlayer insulating film IL7, the interlayer insulating film IL8 is formed on the interlayer insulating film IL7 in which the wiring M6 is embedded, and the pad PD is formed on this interlayer insulating film IL8. Each of the interlayer insulating films IL1 to IL8 can be formed as a single-layer insulating film (for example, a silicon oxide film), or as a laminated film of a plurality of insulating films. Thereafter, an insulating film PV is formed on the interlayer insulating film IL8 so as to cover the pad PD, and in this insulating film PV, the opening portion OP that exposes a part of the pad PD is formed. The insulating film PV does not completely cover the whole of the pad PD, but covers a side surface of the pad PD and a region of the upper surface of the pad PD other than a portion exposed from the opening portion OP.

Each of the plugs V1 is composed of a conductor, and is disposed under the wiring M1. The plugs V1 electrically connect the wirings M1 to various semiconductor regions (for example, the source/drain region SD), the gate electrodes GE and the like formed on the semiconductor substrate SB.

Each of the via portions V2 is composed of a conductor, is formed integrally with the wiring M2, is disposed between the wiring M2 and the wiring M1, and electrically connects the wiring M2 and the wiring M1 to each other. That is, by using a dual damascene method, the wiring M2 and the via portion V2 formed integrally with the wiring M2 are embedded in the interlayer insulating film IL3. As another mode, it is also possible to form the via portion V2 and the wiring M2 separately from each other by using a single damascene method, and the same is true for the via portions V3, V4, V5, V6 and V7.

Each of the via portions V3 is composed of a conductor, is formed integrally with the wiring M3, is disposed between the wiring M3 and the wiring M2, and electrically connects the wiring M3 and the wiring M2 to each other. That is, by using a dual damascene method, the wiring M3 and the via portion V3 formed integrally with the wiring M3 are embedded in the interlayer insulating film IL4.

Each of the via portions V4 is composed of a conductor, is formed integrally with the wiring M4, is disposed between the wiring M4 and the wiring M3, and electrically connects the wiring M4 and the wiring M3 to each other. That is, by using a dual damascene method, the wiring M4 and the via portion V4 formed integrally with the wiring M4 are embedded in the interlayer insulating film IL5.

Each of the via portions V5 is composed of a conductor, is formed integrally with the wiring M5, is disposed between the wiring M5 and the wiring M4, and electrically connects the wiring M5 and the wiring M4 to each other. That is, by using a dual damascene method, the wiring M5 and the via portion V5 formed integrally with the wiring M5 are embedded in the interlayer insulating film IL6.

Each of the via portions V6 is composed of a conductor, is formed integrally with the wiring M6, is disposed between the wiring M6 and the wiring M5, and electrically connects the wiring M6 and the wiring M5 to each other. That is, by using a dual damascene method, the wiring M6 and the via portion V6 formed integrally with the wiring M6 are embedded in the interlayer insulating film IL7.

Moreover, here, the wirings M1, M2, M3, M4, M5 and M6 are illustrated and described as damascene wirings (embedded wirings) formed by the damascene method; however, are not limited to the damascene wirings, can also be formed by patterning conductor films for wiring, and for example, can also be aluminum wirings.

As shown in FIG. 6 and FIG. 7, in the interlayer insulating film IL8, an opening portion (through hole) SH is formed at a position overlapping the pad PD in plan view, and the via portion V7 is formed (embedded) in the opening portion SH. The via portion V7 is composed of a conductor, is formed between the pad PD and the wiring M6, and electrically connects the pad PD and the wiring M6 to each other. That is, by using the single damascene method, the via portion V7 is embedded in the interlayer insulating film IL8.

Note that, though the via portion V7 and the pad PD are formed separately from each other in this embodiment, it is also possible to form the via portion V7 and the pad PD integrally with each other as another mode. In the case of forming the via portion V7 and the pad PD integrally with each other, a part of the pad PD fills the opening portion SH of the interlayer insulating film IL8, whereby the via portion V7 is formed.

On the semiconductor substrate SB, the wiring structure (multilayer wiring structure) including the plurality of insulating films (interlayer insulating films) and the plurality of wiring layers is formed, and the pad PD is included in the uppermost wiring layer among the plurality of wiring layers included in the wiring structure formed on the semiconductor substrate SB. Moreover, the wiring M6 is a wiring in the wiring layer just below the uppermost wiring layer among the plurality of wiring layers included in the wiring structure.

A thickness of the wiring M6 is larger than respective thicknesses of the wirings M1, M2, M3, M4 and M5, and a thickness of the pad PD is larger than the thickness of the wiring M6. Moreover, a width of the wiring M6 is larger than respective widths of the wirings M1, M2, M3, M4 and M5, and a width of the pad PD is larger than the width of the wiring M6. Note that the width of the wiring corresponds to a width (dimension) in a direction that is substantially parallel to the main surface of the semiconductor substrate SB and is substantially perpendicular to an extending direction of the wiring. Moreover, the width of the pad PD corresponds to a dimension in a short-side direction of the pad PD. Furthermore, respective thicknesses of the interlayer insulating films IL7 and IL8 are larger than respective thicknesses of the interlayer insulating films IL2, IL3, IL4, IL5 and IL6.

Note that, here, the description has been given of the case where the number of wiring layers included in the wiring structure formed on the semiconductor substrate SB is totally seven, including the wiring layer in which the pad PD is formed; however, the number of wiring layers included in the wiring structure formed on the semiconductor substrate SB is not limited to this, and is changeable in various ways. However, the plurality of wiring layers are included in the wiring structure formed on the semiconductor substrate SB, and the pad PD is included in the uppermost wiring layer among the plurality of wiring layers.

As shown in FIG. 6 and FIG. 7, the pad PD is formed on the interlayer insulating film IL8, the insulating film (passivation film) PV is formed on the interlayer insulating film IL8 so as to cover a part of the pad PD, and a part of the pad PD is exposed from the opening portion OP provided in the insulating film PV. That is, the opening portion OP is an opening portion for the pad PD, and the opening portion OP is included in the pad PD in plan view. Therefore, a plane dimension (plane area) of the opening portion OP is smaller than a plane dimension (plane area) of the pad PD, and the pad PD has a portion exposed from the opening portion OP (that is, a portion that overlaps the opening portion OP in plan view) and a portion covered with the insulating film PV (that is, a portion that does not overlap the opening portion OP in plan view).

The insulating film PV is the uppermost film of the semiconductor device (semiconductor chip) CP, and can function as a surface protection film. That is, the insulating film PV is a passivation film. However, a part of the metal film ME is formed on the insulating film PV. Respective plane shapes of the pad PD, the opening portion OP and the metal film ME are, for example, are quadrangular (more specifically, rectangular). As the insulating film PV, a single-layer insulating film or a laminated insulating film formed by laminating a plurality of insulating films on one another can be used. FIG. 7 shows a case where the insulating film PV is composed of a laminated film (laminated insulating film) of an insulating film PV1 and an insulating film PV2 on the insulating film PV1. The insulating film PV1 is preferably a silicon nitride film, and the insulating film PV2 is preferably a silicon oxide film.

The pad PD is an aluminum pad mainly formed of aluminum (Al). Specifically, as shown in FIG. 7, the pad PD is formed of a laminated film including: a barrier conductor film (barrier conductive film) BR1; an aluminum (Al)-containing conductive film AM1 on the barrier conductor film BR1; and a barrier conductor film (barrier conductive film) BR2 on the Al-containing conductive film AM1. Note that, in a portion of the pad PD, which is located under the insulating film PV, the barrier conductor film BR2 is formed on the Al-containing conductive film AM1, and in a portion of the pad PD, which is exposed from the opening portion OP of the insulating film PV, the barrier conductor film BR2 is not formed on the Al-containing conductive film AM1. This is because the barrier conductor film BR2 of the portion exposed from the opening portion OP of the insulating film PV is removed.

The Al-containing conductive film AM1 is a conductive film containing aluminum (Al), and preferably, is composed of a conductive material film (but a conductive material film exhibiting metal conduction) containing aluminum (Al) as a main component (main body). As the Al-containing conductive film AM1, an aluminum film (pure aluminum film) can be used; however, without being limited to this, a compound film or an alloy film, which contains aluminum (Al) as a main component (main body), can also be used. For example, a compound film or alloy film of aluminum (Al) and silicon (Si), or a compound film or alloy film of aluminum (Al) and copper (Cu), or a compound film or alloy film of aluminum (Al), silicon (Si) and copper (Cu) can be suitably used as the Al-containing conductive film AM1. A composition ratio (content ratio) of aluminum (Al) in the Al-containing conductive film AM1 is larger 50 atom % (that is, Al-containing conductive film AM1 is Al-rich), and preferably, 98 atom % or more.

Both of the barrier conductor film BR1 and the barrier conductor film BR2 are conductive films (preferably, conductive films exhibiting metal conduction). Between these, the barrier conductor film BR1 has a function to enhance adhesion with an underlying base (for example, the interlayer insulating film IL8) and to prevent delamination therefrom. Therefore, desirably, the barrier conductor film BR1 is excellent in adhesion with the underlying base (for example, the interlayer insulating film IL8) and in adhesion with the Al-containing conductive film AM1 formed on the barrier conductor film BR1. As the barrier conductor film BR1, for example, a laminated film of a titanium (Ti) film, a titanium nitride (TiN) film and a titanium (Ti) in order from the bottom can be suitably used. Besides, for example, a single film of a titanium (Ti) film, a single film of a titanium nitride (TiN) film, a laminated film of a titanium (Ti) film and a titanium nitride (TiN) film or the like can be used as the barrier conductor film BR1.

The barrier conductor film BR2 has a function to enhance adhesion with the insulating film PV and to prevent delamination therefrom. Therefore, desirably, the barrier conductor film BR2 is excellent in adhesion with the Al-containing conductive film AM1 as an underlying base and in adhesion with the insulating film PV formed on the barrier conductor film BR2. Moreover, the barrier conductor film BR2 can also function as an antireflection film in a photolithography process.

As the barrier conductor film BR2, a titanium nitride (TiN) film can be suitably used. Besides, for example, a titanium (Ti) film, a tantalum (Ta) film, a tantalum nitride (TaN) film, a tungsten (W) film, a tungsten nitride (WN) film, a titanium tungsten (TiW) film or a tantalum tungsten (TaW) film can be used as the barrier conductor film BR2.

The Al-containing conductive film AM1 can function as a main conductor film of the pad PD. A thickness of the Al-containing conductive film AM1 is larger than respective thicknesses of the barrier conductor films BR1 and BR2. The pad PD is mainly formed of the Al-containing conductive film AM1, and accordingly, can be regarded as an aluminum pad. Moreover, as another mode, either one or both of the barrier conductor films BR1 and BR2 can be omitted if unnecessary.

The pad PD is electrically connected to the wiring M6 in the layer lower than the pad PD through the via portion V7. The via portion V7 is preferably formed at a position that overlaps the pad PD but does not overlap the opening portion OP in plan view. That is, preferably, the via portion V7 is disposed under the pad PD in a portion covered with the insulating film PV.

As another mode, it is also possible to adopt the structure in which a wiring in the same layer as the pad PD is connected to the pad PD and the wiring is electrically connected to the wiring M6 in a lower layer through a via portion in the same layer as the via portion V7 (through a conductive via portion embedded in the interlayer insulating film IL8). In that case, it is not necessary to provide the via portion V7 under the pad PD. Also, the wiring formed in the same layer as the pad PD and connected to the pad PD is formed integrally with the pad PD, and a via portion in the same layer as the via portion V7 just needs to be disposed under the wiring.

The metal film (metal layer) ME is formed over the pad PD exposed from the opening portion OP of the insulating film PV and the insulating film PV around the opening portion OP. The metal film ME integrally includes a portion located on the insulating film PV (that is, a portion hanging on the insulating film PV) and a portion located on the pad PD exposed from the opening portion OP of the insulating film PV. A plane dimension (plane area) of the metal film ME is larger than the plane dimension (plane area) of the opening portion OP, and the opening portion OP is included in the metal film ME in plan view.

The metal film ME is not a bump electrode but a base film when performing the wire bonding, and can function as an over pad metal (OPM) film. Therefore, the above-described wire BW as a connecting member is bonded to the metal film ME, and the above-described wire BW is electrically connected to the pad PD through the metal film ME (refer to FIG. 10 to be mentioned later).

In this embodiment, the metal film ME is formed on the pad PD exposed from the opening portion OP of the insulating film PV, and accordingly when the wire bonding is performed for the pad PD, the wire BW is bonded (connected) to the metal film ME on the pad PD. That is, the wire BW is bonded (connected) to the metal film ME (first portion MEa of the metal film ME) located on the pad PD exposed from the opening portion OP of the insulating film PV. In other words, the wire BW is not directly bonded (connected) to the pad PD, but in a state where the metal film ME is formed on the pad PD, the wire BW is pressed and bonded (connected) to the metal film ME on the pad PD. Therefore, when the wire bonding is performed to electrically connect the wire BW to the pad PD, the metal film ME is interposed between the pad PD and the wire BW.

Here, a portion of the metal film ME located on the pad PD exposed from the opening portion OP of the insulating film PV will be referred to as the first portion Mea, and a portion of the metal film ME located on the insulating film PV (that is, a portion hanging on the insulating film PV) will be referred to as a second portion MEb (refer to FIG. 7). The metal film ME integrally includes the first portion MEa and the second portion MEb. The insulating film PV is present under the second portion MEb of the metal film ME, and further, the pad PD is present under the insulating film PV. Meanwhile, under the first portion MEa of the metal film ME, the insulating film PV is not present, but the pad PD is present.

The second portion MEb of the metal film ME is not formed over the entire insulating film PV, but is formed on a part of the insulating film PV. The metal film ME located on the insulating film PV (that is, the second portion MEb of the metal film ME) and the metal film ME located on the pad PD exposed from the opening portion OP of the insulating film PV (that is, the first portion MEa of the metal film ME) are not isolated from each other, but are formed continuously (integrally) with each other.

The metal film ME is in contact with the upper surface of the pad PD exposed from the opening portion OP of the insulating film PV, an inner wall of the opening portion OP of the insulating film PV (that is, a side surface of the insulating film PV), and an upper surface of the insulating film PV. An outer periphery (outer peripheral side surface) of the metal film ME is located on the insulating film PV. In the portion of the pad PD exposed from the opening portion OP, the barrier conductor film BR2 on the Al-containing conductive film AM1 is removed, and thus the metal film ME is formed on the Al-containing conductive film AM1 of the pad PD (so as to be in contact with the Al-containing conductive film AM1) on a bottom of the opening portion OP of the insulating film PV.

The metal film ME is a single-layer metal film or a laminated metal film formed by laminating a plurality of metal films on one another. Here, as shown in FIG. 7, the metal film ME is composed of a laminated film (laminated metal film) of a metal film (metal layer) ME1 and a metal film (metal layer) ME2 located on the metal film ME1. The metal film ME2 is a plated film (metal-plated film), and is formed by a plating method (more specifically, an electroplating method). The metal film ME1 is used as a seed layer (power-feeding conductor layer) when forming the metal film ME2. A thickness of the metal film ME2 is larger than a thickness of the metal ME1, and the metal film ME is mainly composed of the metal film ME2.

The metal film ME2 is a film (uppermost film) which the above-described wire BW is brought into contact with and bonded to when electrically connecting the wire BW to the pad PD by the wire bonding. When a surface of the metal film ME2 is oxidized, it becomes difficult to bond the wire BW to the metal film ME2. Accordingly, it is preferable that the metal film ME2 be made of metal difficult to oxidize. Moreover, the metal film ME2 is preferably made of a material to which the wire BW can be easily bonded and which is able to increase a bonding strength of the wire BW. Moreover, the material of the metal film ME2 is preferably selected so that an easily corrosive reactant (reaction product) is not formed even if the metal film ME2 and the wire BW react with each other. In consideration of such a viewpoint, the metal film ME2 is preferably a gold (Au) film.

The metal film ME1 is used as the seed layer when forming the metal film ME2. Preferably, the metal film ME1 is made of such a material that increases adhesion (adhesive properties) to the metal film ME2 formed on the metal film ME1. Moreover, preferably, the metal film ME1 is made of such a material that increases adhesion (adhesive properties) to the underlying base (here, the pad PD and the insulating film PV). Furthermore, preferably, the metal film ME1 is made of a material having barrier properties against aluminum (Al) that constitutes the pad PD and the metal that constitutes the metal film ME2.

In consideration of such a viewpoint, as the metal film ME1, it is possible to suitably use a single-layer film or a laminated film, which is composed of one or more layers selected from a titanium (Ti) film, a titanium nitride film (TiN) film, a tantalum (Ta) film, a titanium nitride (TaN) film, a tungsten (W) film, a tungsten nitride (WN) film, a titanium tungsten (TiW) film and a tantalum tungsten (TaW) film. Note that a metal compound film exhibiting metal conduction such as the titanium nitride film mentioned above can also be regarded as a metal film, and the metal compound film exhibiting metal conduction can also be used as the metal film ME1. However, preferably, the metal film ME1 includes the titanium (Ti) film, and a single-layer film of a titanium (Ti) film or a laminated film of a titanium (Ti) film and a palladium (Pd) film on the titanium film can be particularly suitably used as the metal film ME1.

Figure 8:
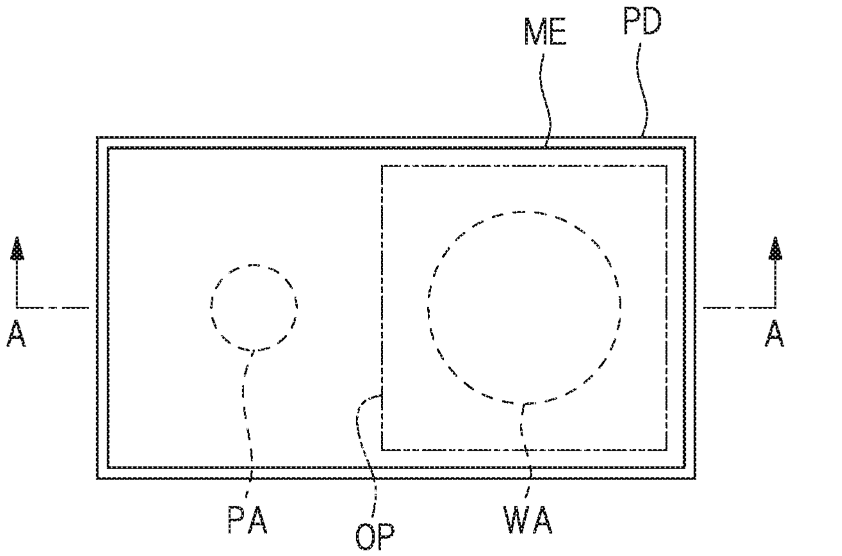
FIG. 8 is a plan view showing a principal part of the semiconductor device according to one embodiment.
Figure 9:
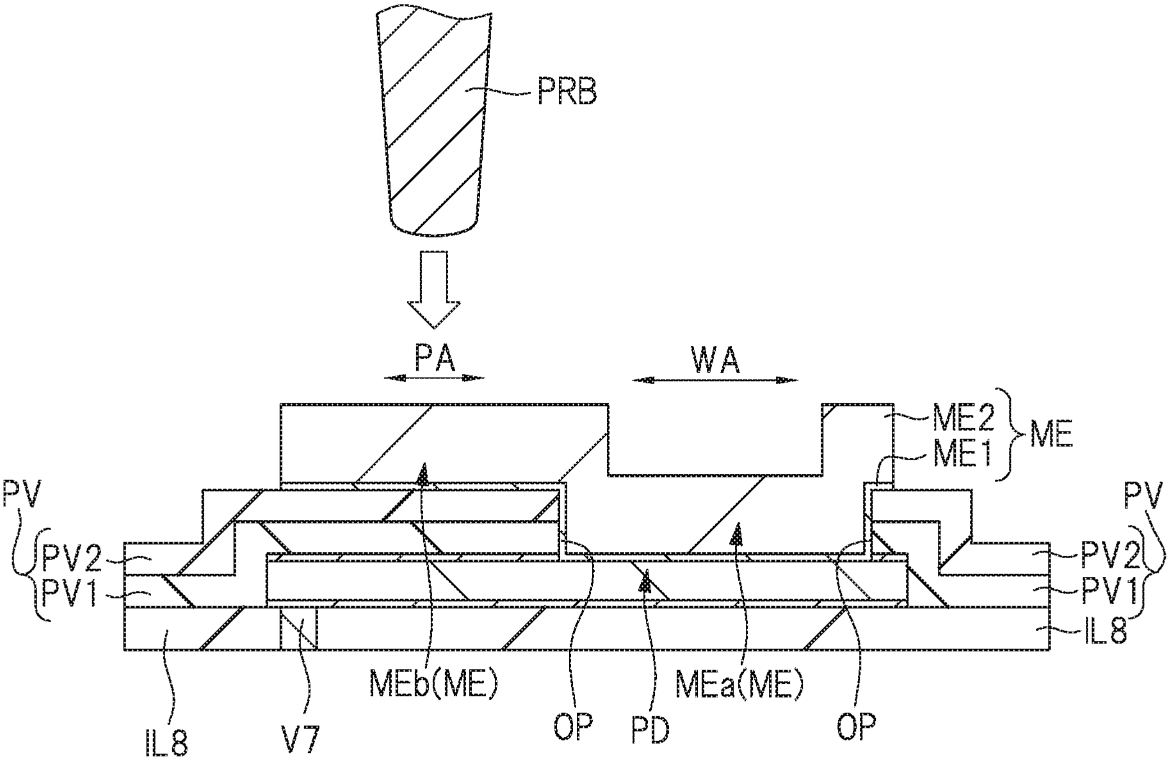
FIG. 9 is a cross-sectional view showing a state where a probe is brought into contact with a metal film shown in FIG. 7 at a time of a probe inspection.
Figure 10:
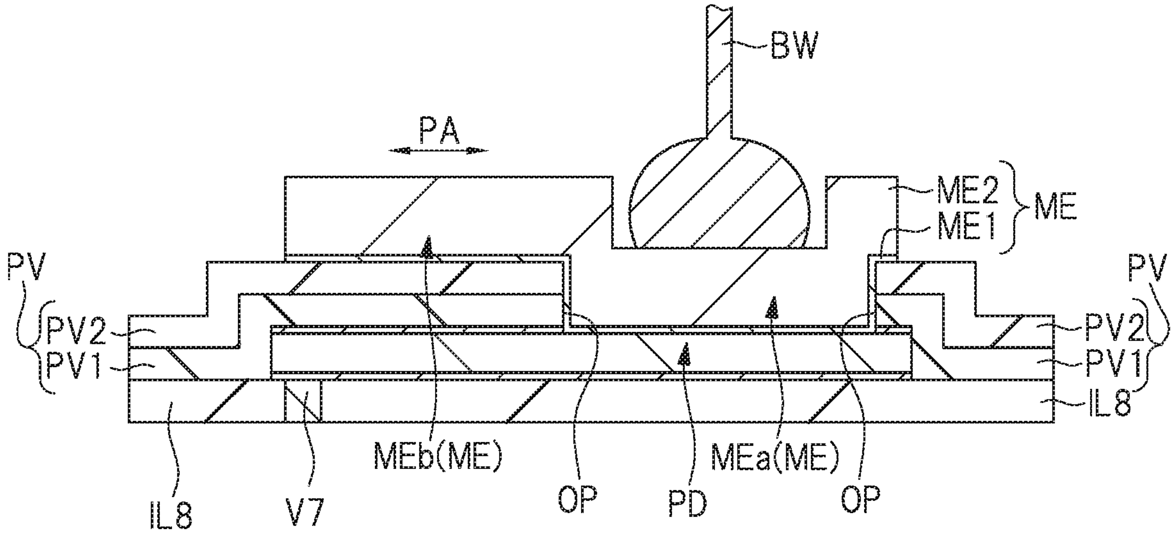
FIG. 10 is a cross-sectional view showing a state where a wire is bonded to the metal film shown in FIG. 7.

FIG. 8 is a plan view showing a principal part of the semiconductor device (semiconductor chip) CP according to this embodiment, and a plan view of a formation region of the pad PD and the metal film ME is shown. The pad PD and the metal film ME which are shown in the cross-sectional view of FIG. 7 mentioned above substantially correspond to a cross-sectional view taken at a position of line A-A of FIG. 8. In FIG. 8, the pad PD and the metal film ME are indicated by solid lines, the opening portion OP of the insulating film PV is indicated by a chain double-dashed lines, and a wire bonding region WA and a probe contact region PA are indicated by broken lines (dotted lines). Moreover, FIG. 9 is across-sectional view showing a state of bringing a probe (probe needle) PRB into contact with the probe contact region PA of the metal film ME in FIG. 7 at the time of the probe inspection, and a cross-sectional view corresponding to FIG. 7 mentioned above is shown. Moreover, FIG. 10 is a cross-sectional view showing a state where the wire (bonding wire) BW is bonded to the wire bonding region WA of the metal film ME in FIG. 7, and a cross-sectional view corresponding to FIG. 7 mentioned above is shown. In a similar way to FIG. 7 mentioned above, also in FIG. 9 and FIG. 10, illustration of the structure below the interlayer insulating film IL8 is omitted. Moreover, in the semiconductor devices PKG1 and PKG2 in FIG. 2 and FIG. 3 mentioned above, the wire BW is bonded to the metal film ME as in FIG. 10, but illustration of the sealing resin (corresponding to the above-described sealing portions MR1 and MR2) is omitted in FIG. 10.

As shown in FIG. 9, in the probe inspection step, the probe PRB does not contact the pad PD, but contacts the metal film ME. Also, as shown in FIG. 10, in the wire bonding step, the above-described wire BW is not bonded to the pad PD, but is bonded to the metal film ME.

In this embodiment, a region on the upper surface of the metal film ME which the probe (probe needle) contacts at the time of an electrical characteristic test (probe inspection) of the semiconductor chip (or a chip region before dicing) will be referred to as the probe contact region PA. In the probe inspection, the probe contacts the probe contact region PA on the upper surface of the metal film ME, and a probe mark is formed thereon. Therefore, at a stage before performing the probe inspection, the probe contact region PA can also be regarded as a region which the probe is scheduled to contact in the probe inspection. Moreover, during the probe inspection, the probe contact region PA can also be regarded as a region which the probe contacts. Furthermore, after the probe inspection is performed, the probe contact region PA can also be regarded as a region where the probe mark is formed. Note that the upper surface of the metal film ME corresponds to the upper surface of the metal film ME2.

Moreover, in this embodiment, a region on the metal film ME to which a wire (corresponding to the above-described wire BW) is bonded (connected) on the upper surface will be referred to as the wire bonding region (wire connecting region) WA. In the wire bonding step (corresponding to the above-described Steps S3 and S13) when manufacturing the semiconductor package, the wire (BW) is bonded (connected) to the wire bonding region WA on the upper surface of the metal film ME, so that the wire (BW) is bonded (connected) to the wire bonding region WA of the metal film ME in a manufactured semiconductor package (corresponding to the above-described semiconductor device PKG). Therefore, at a stage before bonding the wire to the metal film ME, the wire bonding region WA can also be regarded as a region which the wire is scheduled to be bonded. At a stage after the wire is bonded to the metal film ME, the wire bonding region WA can also be regarded as a region to which the wire is bonded.

FIG. 9 shows a state of bringing the probe PRB into contact with the metal film ME at the time of the probe inspection. The probe is brought into contact with the probe contact region PA on the upper surface of the metal film ME, whereby an electrical test (probe inspection) can be performed. Moreover, FIG. 10 shows a state where the wire BW is electrically connected to the metal film ME, and the wire BW is bonded and electrically connected to the wire bonding region WA on the upper surface of the metal film ME.

The probe contact region PA and the wire bonding region WA are shown in FIG. 7 and FIG. 8. The probe contact region PA and the wire bonding region WA are plane regions different from each other, and do not overlap each other in plan view. Therefore, in the probe inspection, the probe contacts the probe contact region PA of the metal film ME and the probe mark is formed. Meanwhile, the probe does not contact the wire bonding region WA of the metal film ME, and the probe mark is not formed. Moreover, in a wire bonding step (corresponding to the above-described Steps S3 and S13), a wire (corresponding to the above-described wire BW) is bonded to the wire bonding region WA of the metal film MA, but the wire (corresponding to the above-described wire BW) is not bonded to the probe contact region PA of the metal film ME. Each of the probe contact region PA and the wire bonding region WA is included in the metal film ME in plan view, and moreover, is included in the pad PD in plan view.

Note that the reason why the probe contact region PA and the wire bonding region WA are made to be different plane regions is as follows. That is, in the probe inspection, the probe is pressed against the probe contact region PA on the upper surface of the metal film ME to perform the electrical inspection. Therefore, when the probe inspection is performed, the probe mark is formed in the probe contact region PA of the metal film ME. On the upper surface of the metal film ME, planarity is lowered in the region on which the probe mark is formed. Therefore, when the wire (BW) is attempted to be bonded to the region where the probe mark is formed on the upper surface of the metal film ME in the wire bonding step, it is apprehended that the bonding strength of the wire (BW) may decrease. Therefore, desirably, the wire (BW) is bonded to the region where the probe mark is not formed on the upper surface of the metal film ME, and in order to enable this configuration, the probe contact region PA and the wire bonding region WA are made to be different plane regions in this embodiment. In this way, in the probe inspection, the probe contacts the probe contact region PA of the metal film ME and the probe mark is formed, but in the wire bonding step, the wire (BW) can be bonded to the wire bonding region WA where the probe mark is not formed. Hence, since the bonding strength of the wire (BW) can be enhanced, reliability of the connection of the wire (BW) can be enhanced, and eventually, reliability of the semiconductor package can be enhanced.

In this embodiment, in plan view, the wire bonding region WA does not overlap the insulating film PV, but overlaps the opening portion OP of the insulating film PV, and is included in the opening portion OP of the insulating film PV. That is, the wire bonding region WA is present in the first portion MEa of the metal film ME, and the wire BW is bonded to the first portion MEa of the metal film ME. Therefore, below the wire bonding region WA, the metal film ME and the pad PD located thereunder are disposed, but the insulating film PV is not disposed, and the insulating film PV is not interposed between the metal film ME and the pad PD below the wire bonding region WA. That is, in plan view, though the whole of the wire bonding region WA overlaps the metal film ME and the pad PD, the wire bonding region WA does not overlap the insulating film PV.

Moreover, in this embodiment, in plan view, the probe contact region PA does not overlap the opening portion OP of the insulating film PV, but overlaps the insulating film PV, and is included in the insulating film PV. That is, the probe contact region PA is present in the second portion MEb of the metal film ME, and the probe contacts the second portion MEb of the metal film ME in the probe inspection, and the probe mark is formed. Therefore, below the probe contact region PA, the metal film ME, the insulating film PV located thereunder, and the pad PD located thereunder are disposed, and the insulating film PV is interposed between the metal film ME and the pad PD below the probe contact region PA. That is, in plan view, the whole of the probe contact region PA overlaps the metal film ME, the insulating film PV and the pad PD.

As described above, in this embodiment, in the probe inspection, the probe contacts the second portion MEb of the metal film ME, which is located on the insulating film PV, and the probe mark is formed. Also, in the wire bonding step, the wire BW is bonded to the first portion MEa of the metal film ME, which is located on the pad PD exposed from the opening portion OP of the insulating film PV.

FIG. 8 shows a case where each plane shape of the metal film ME and the pad PD is rectangular, in which the probe contact region PA and the wire bonding region WA are arrayed in a long-side direction (lateral direction in FIG. 8) of the metal film ME. For example, the long-side direction of the metal film ME is a direction substantially parallel to the upper surface of the semiconductor device CP, and substantially perpendicular to a side of the upper surface of the CP (that is, the side that constitutes the outer periphery of the upper surface of the semiconductor device CP). Moreover, the long-side direction of the metal film ME and a long-side direction of the pad PD are substantially parallel to each other. Moreover, FIG. 8 shows a case where the plane dimension (plane area) of the metal film ME is a little smaller than the plane dimension (plane area) of the pad PD and the metal film ME is included in the pad PD in plan view. As another mode, a part of the metal film ME may protrude from the pad PD in plan view.

An example of the dimensions is described below; however, the dimensions are not limited to this. The long side (lateral dimension in FIG. 8) of the metal film ME is, for example, 90 to 115 μm, and a short side (longitudinal dimension in FIG. 8) of the metal film ME is, for example, 50 to 60 μm. Moreover, a long side (lateral dimension in FIG. 8) of the pad PD is, for example, 105 to 130 μm, and a short side (longitudinal dimension in FIG. 8) of the pad PD is, for example, 55 to 65 μm. Furthermore, a plane shape of the opening portion OP is preferably rectangular or square, and a length of each side thereof is, for example, 45 to 55 μm. The wire bonding region WA is a substantially circular region with a diameter of, for example, 35 to 45 μm, and the probe contact region PA is a substantially circular region with a diameter of, for example, 7 to 12 μm. Moreover, the plane shape of the probe contact region PA can be other than circular depending on a shape of the probe for use in the probe inspection.

<Manufacturing Process of Semiconductor Device>

The manufacturing process of the semiconductor device CP according to this embodiment will be described with reference to FIG. 11 to FIG. 22. FIG. 11 to FIG. 22 are cross-sectional views each showing a principal part in the manufacturing process of the semiconductor device CP according to this embodiment.

Figure 11:
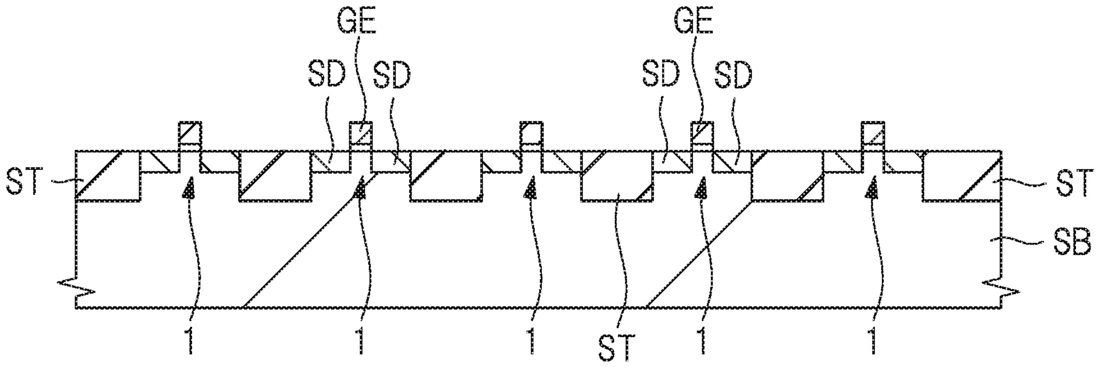
FIG. 11 is a cross-sectional view showing a principal part of the semiconductor device according to one embodiment during the manufacturing process.

First, the semiconductor substrate (semiconductor wafer) SB made of single crystal silicon or the like is prepared, and then a semiconductor element such as a MISFET is formed on the semiconductor substrate SB by using a known semiconductor manufacturing technology. For example, as shown in FIG. 11, the element isolation region ST is formed in the semiconductor substrate SB by using a shallow trench isolation (STI) method, a well region (not shown) is formed in the semiconductor substrate SB by using anion implantation method, the gate electrodes GE are formed on the semiconductor substrate SB (well region) with a gate insulating film interposed therebetween, and the source/drain regions SD are formed in the semiconductor substrate SB (well region) by using the ion implantation method. In this way, the MISFET 1 is formed on the semiconductor substrate SB.

Figure 12:
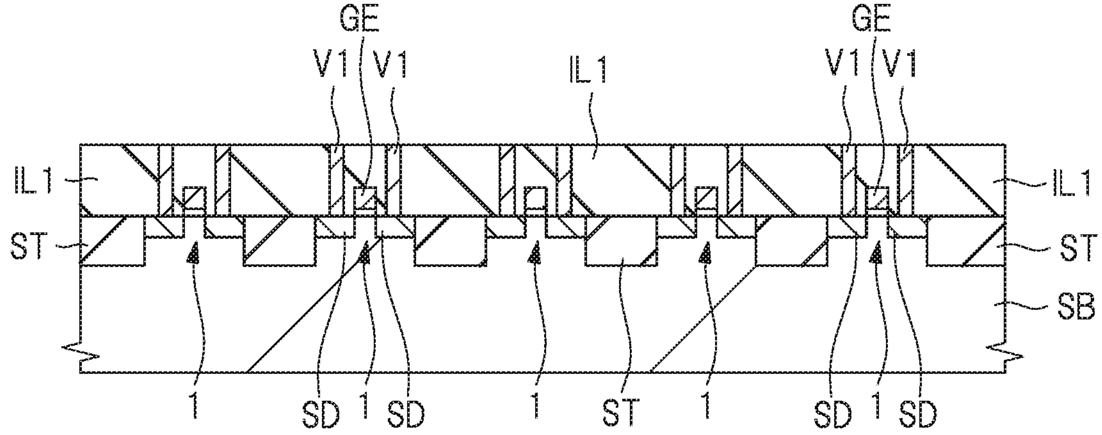
FIG. 12 is a cross-sectional view showing a principal part of the semiconductor device during the manufacturing process continued from FIG. 11.

Next, as shown in FIG. 12, the interlayer insulating film IL1 is formed on the semiconductor substrate SB so as to cover the MISFET 1, contact holes are formed in the interlayer insulating film IL1 by using a photolithography technology and a dry etching technology, and a conductive film is embedded in the contact holes, whereby the plugs V1 are formed.

Figure 13:
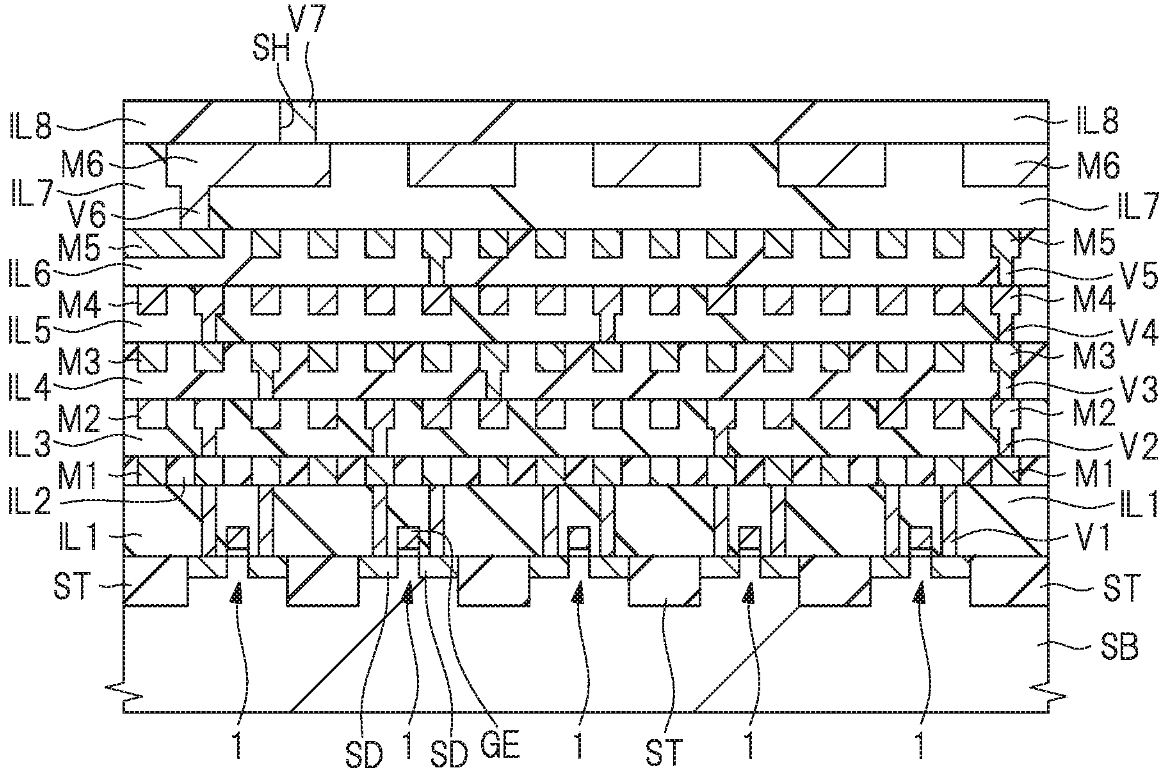
FIG. 13 is a cross-sectional view showing a principal part of the semiconductor device during the manufacturing process continued from FIG. 12.

Next, as shown in FIG. 13, the interlayer insulating film IL2 is formed on the interlayer insulating film IL1 in which the plugs V1 are embedded, and then the wiring M1 is embedded in the interlayer insulating film IL2 by using a single damascene technology. Thereafter, the interlayer insulating film IL3 is formed on the interlayer insulating film IL2 in which the wiring M1 is embedded, and then the wiring M2 and the via portions V2 are embedded in the interlayer insulating film IL3 by using a dual damascene technology. Thereafter, the interlayer insulating film IL4 is formed on the interlayer insulating film IL3 in which the wiring M2 is embedded, and then the wiring M3 and the via portions V3 are embedded in the interlayer insulating film IL4 by using the dual damascene technology. Thereafter, the interlayer insulating film IL5 is formed on the interlayer insulating film IL4 in which the wiring M3 is embedded, and then the wiring M4 and the via portions V4 are embedded in the interlayer insulating film IL5 by using the dual damascene technology. Thereafter, the interlayer insulating film IL6 is formed on the interlayer insulating film IL5 in which the wiring M4 is embedded, and then the wiring M5 and the via portions V5 are embedded in the interlayer insulating film IL6 by using the dual damascene technology. Thereafter, the interlayer insulating film IL7 is formed on the interlayer insulating film IL6 in which the wiring M5 is embedded, and then the wiring M6 and the via portions V6 are embedded in the interlayer insulating film IL7 by using the dual damascene technology. Thereafter, the interlayer insulating film IL8 is formed on the interlayer insulating film IL7 in which the wiring M6 is embedded. The respective thicknesses of the interlayer insulating films IL7 and IL8 are larger than the respective thicknesses of the interlayer insulating films IL2, IL3, IL4, IL5 and IL6.

Next, the opening portion SH is formed in the interlayer insulating film IL8 by using the photolithography technology and an etching technology. When the opening portion SH is formed in the interlayer insulating film IL8, the upper surface of the wiring M6 is exposed on the bottom of the opening portion SH.

Next, the conductive film for the via portion V7 is formed on the interlayer insulating film IL8 so as to fill the opening portion SH, then the conductive film (conductive film for the via portion V7) outside the opening portion SH is removed by using a chemical mechanical polishing (CMP) method, an etch back method or the like, and the conductive film (conductive film for the via portion V7) is left in the opening portion SH. In this way, the via portion V7 composed of the conductive film embedded in the opening portion SH can be formed.

As the interlayer insulating films IL2 to IL8, for example, silicon oxide films can be used; however, low-dielectric-constant films (low-k films) are also usable. Here, the low-dielectric-constant film refers to an insulating film whose relative dielectric constant is lower than a relative dielectric constant (=3.8 to 4.3) of silicon oxide ($SiO_2$), and particularly, refers to an insulating film whose relative dielectric constant is lower than 3.3.

Figure 14:
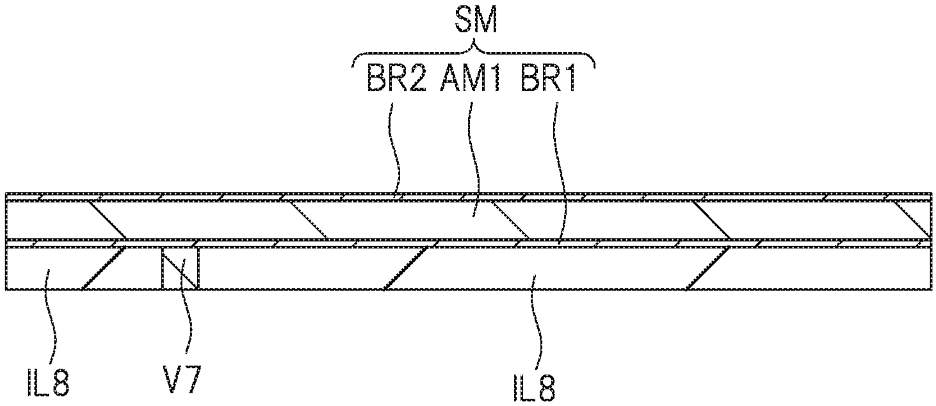
FIG. 14 is a cross-sectional view showing a principal part of the semiconductor device during the manufacturing process continued from FIG. 13.

Next, as shown in FIG. 14, the barrier conductor film BR1, the Al-containing conductive film AM1 and the barrier conductor film BR2 are sequentially formed on the interlayer insulating film IL8 in which the via portion V7 is embedded, whereby a laminated film SM of the barrier conductor film BR1, the Al-containing conductive film AM1 located on the barrier conductor film BR1, and the barrier conductor film BR2 located on the Al-containing conductive film AM1 is formed. Each of the barrier conductor film BR1, the Al-containing conductive film AM1 and the barrier conductor film BR2 can be formed by using a sputtering method and the like. Note that, in FIG. 14 and in FIGS. 15 to 22 to be mentioned later, illustration of the structure below the interlayer insulating film IL8 is omitted in order to simplify the drawings.

Figure 15:
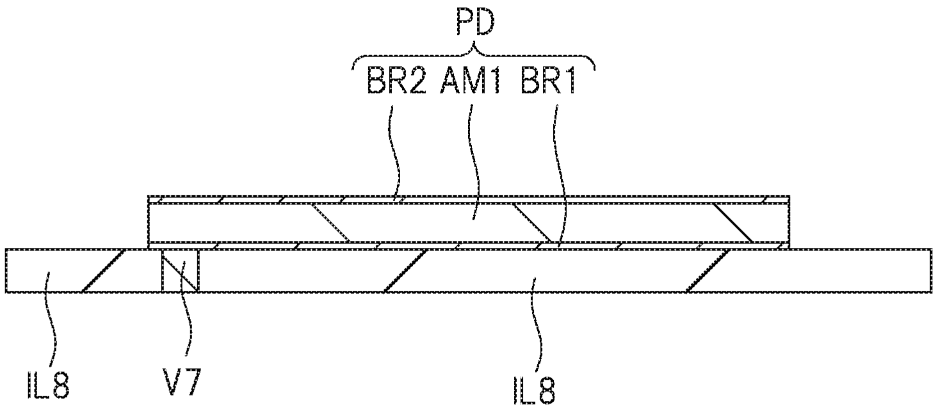
FIG. 15 is a cross-sectional view showing a principal part of the semiconductor device during the manufacturing process continued from FIG. 14.

Next, as shown in FIG. 15, the laminated film SM is patterned by using the photolithography technology and the etching technology, whereby the pad PD is formed. That is, a photoresist pattern (not shown) is formed on the laminated film SM by using the photolithography technology, and then the laminated film SM is etched with using the photoresist pattern as an etching mask, whereby the laminated film SM is patterned, and the pad PD composed of the patterned laminated film SM is formed. Thereafter, the photoresist pattern is removed, and FIG. 15 shows this stage. At this stage, the whole of the pad PD is composed of the laminated film of the barrier conductor film BR1, the Al-containing conductive film AM1 located on the barrier conductor film BR1, and the barrier conductor film BR2 located on the Al-containing conductive film AM1. Note that, when patterning the laminated film SM, not only the pad PD but also the wiring in the same layer as the pad PD can be formed, and in that case, the wiring in the same layer as the pad PD is formed on the interlayer insulating film IL8.

Moreover, here, the case of forming the via portion V7 and the pad PD separately from each other has been illustrated and described; however, as another mode, it is also possible to form the via portion V7 integrally with the pad PD. In that case, the laminated film SM is formed on the interlayer insulating film IL8 including the inside of the opening portion SH in a state where the via portion V7 is not formed, and then the laminated film SM is patterned by using the photolithography technology and the etching technology, whereby the pad PD is formed. In this way, the pad PD and the via portion V7 composed of the patterned laminated film SM are formed integrally with each other.

Figure 16:
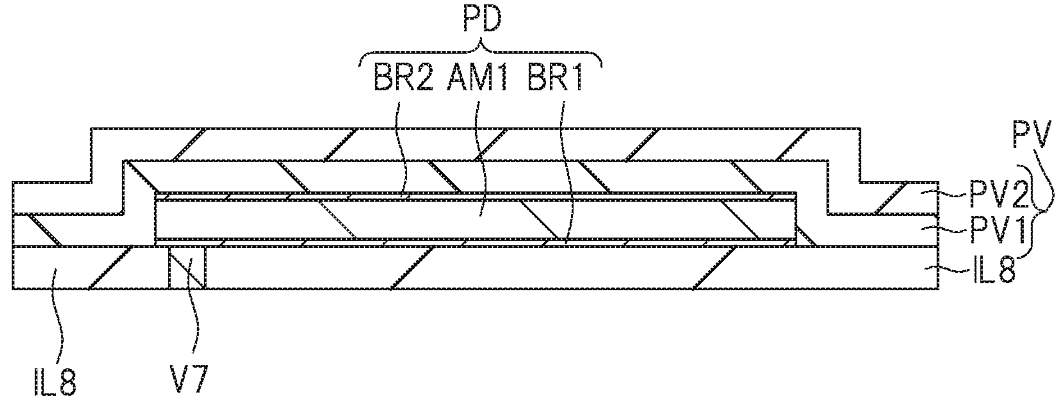
FIG. 16 is a cross-sectional view showing a principal part of the semiconductor device during the manufacturing process continued from FIG. 15.

Next, as shown in FIG. 16, the insulating film PV is formed on the interlayer insulating film IL8 so as to cover the pad PD. As the insulating film PV, a single-layer insulating film or a laminated insulating film formed by laminating a plurality of insulating films on one another can be used. For example, a silicon oxide film or a silicon nitride film or a laminated film of these can be used as the insulating film PV. Moreover, as the insulating film PV, a resin film made of polyimide resin or the like (that is, an organic insulating film) can also be used. FIG. 16 shows a case where the insulating film PV is composed of the laminated film (laminated insulating film) of the insulating film PV1 and the insulating film PV2 on the insulating film PV1. The insulating film PV1 is preferably a silicon nitride film, and the insulating film PV2 is preferably a silicon oxide film.

Figure 17:
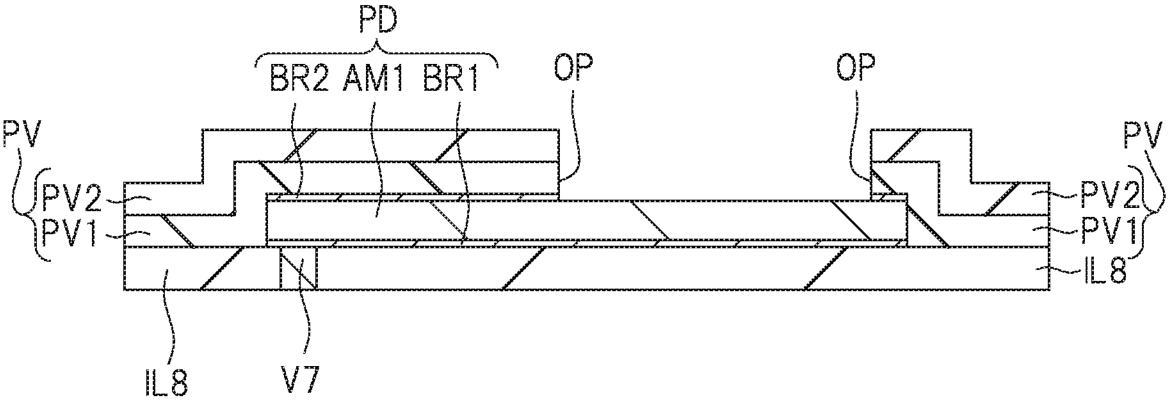
FIG. 17 is a cross-sectional view showing a principal part of the semiconductor device during the manufacturing process continued from FIG. 16.

Next, as shown in FIG. 17, the opening portion OP is formed in the insulating film PV. For example, a photoresist pattern (not shown) is formed on the insulating film PV by using the photolithography technology, and then the insulating film PV is etched with using the photoresist pattern as an etching mask, whereby the opening portion OP can be formed in the insulating film PV. Thereafter, the photoresist pattern is removed, and FIG. 17 shows this stage. The opening portion OP of the insulating film PV is included in the pad PD in plan view.

In the etching step of forming the opening portion OP in the insulating film PV, the opening portion OP is formed in the insulating film PV by etching the insulating film PV to expose the barrier conductor film BR2 of the pad PD from the opening portion OP, and the barrier conductor film BR2 exposed from the opening portion OP is then removed by etching, whereby the Al-containing conductive film AM1 of the pad PD can be exposed from the opening portion OP. That is, in a region that overlaps the opening portion OP in plan view, not only the insulating film PV but also the barrier conductor film BR2 that has constituted the pad PD is etched and removed, and accordingly, the upper surface of the Al-containing conductive film AM1 that constitutes the pad PD is exposed. Meanwhile, in a region covered with the insulating film PV even after the opening portion OP is formed, the barrier conductor film BR2 remains without being removed.

Figure 18:
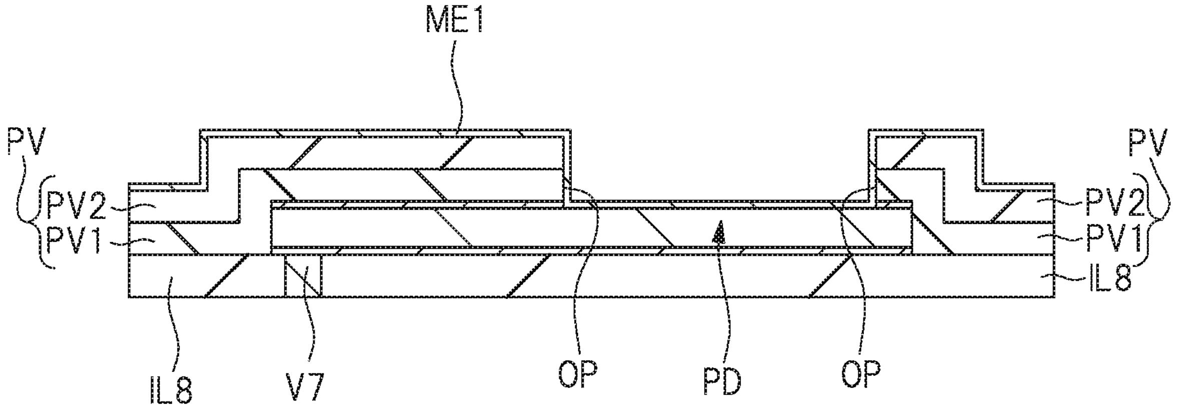
FIG. 18 is a cross-sectional view showing a principal part of the semiconductor device during the manufacturing process continued from FIG. 17.

Next, as shown in FIG. 18, the metal film ME1 is formed on the insulating film PV including the sidewall of the opening portion OP and the surface of the pad PD (that is, the Al-containing conductive film AM1) exposed from the opening portion OP. The metal film ME1 is made of the above-mentioned material, and for example, a single-layer film of titanium (Ti) or a laminated film of a titanium (Ti) film and a palladium (Pd) film located on the titanium film can be suitably used as the metal film ME1. The metal film ME1 can be formed by using, for example, an electroless plating method or the sputtering method. When the metal film ME1 is formed, the upper surface of the pad PD, which is exposed from the opening portion OP, is covered with the metal film ME1, and is brought into contact with the metal film ME1.

Figure 19:
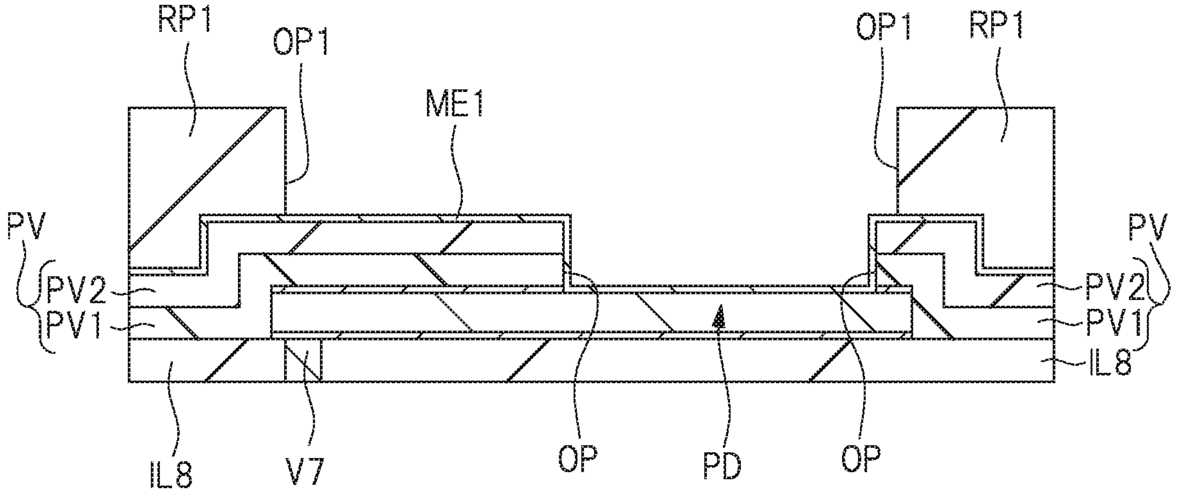
FIG. 19 is a cross-sectional view showing a principal part of the semiconductor device during the manufacturing process continued from FIG. 18.

Next, as shown in FIG. 19, the photoresist layer (photoresist pattern) RP1 is formed on the metal film ME1 by using the photolithography technology. The photoresist layer RP1 has an opening portion OP1 in a region where the metal film ME is scheduled to be formed.

A plane dimension (plane area) of the opening portion OP1 of the photoresist layer RP1 is larger than the plane dimension (plane area) of the opening portion OP of the insulating film PV, and the opening portion OP1 of the photoresist layer RP1 is included in the opening portion OP of the insulating film PV in plan view. Therefore, the sidewall (inner wall) of the opening portion OP of the insulating film PV is located inside the opening portion OP1 of the photoresist layer RP1 in plan view, and not only a portion of the metal film ME1 located on the pad PD but also a portion of the metal film ME1 located on the insulating film PV is exposed from the opening portion OP1 of the photoresist layer RP1.

Figure 20:
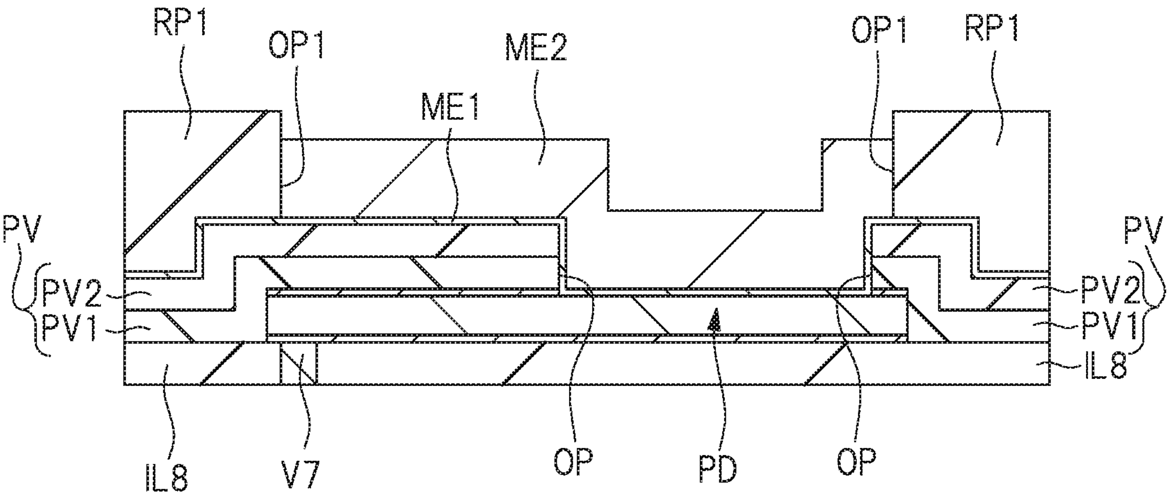
FIG. 20 is a cross-sectional view showing a principal part of the semiconductor device during the manufacturing process continued from FIG. 19.

Next, as shown in FIG. 20, by using the plating method, the metal film ME2 is formed on the metal film ME1 exposed from the opening portion OP1 of the photoresist layer RP1. Therefore, the metal film ME2 is a plated layer. It is preferable to use an electroplating method as the plating method for forming the metal film ME2. When forming the metal film ME2 by the electroplating method, the metal film ME1 can be used as a seed layer (power-feeding conductor layer). Since the metal film ME2 is formed by the electroplating method, the metal film ME2 is selectively formed on the portion of the metal film ME1 exposed from the opening portion OP1 of the photoresist layer RP1. Therefore, the metal film ME2 is selectively formed in the opening portion OP1 of the photoresist layer RP1. The metal film ME2 is made of the above-mentioned material, and a gold (Au) film can be suitably used as the metal film ME2.

Figure 21:
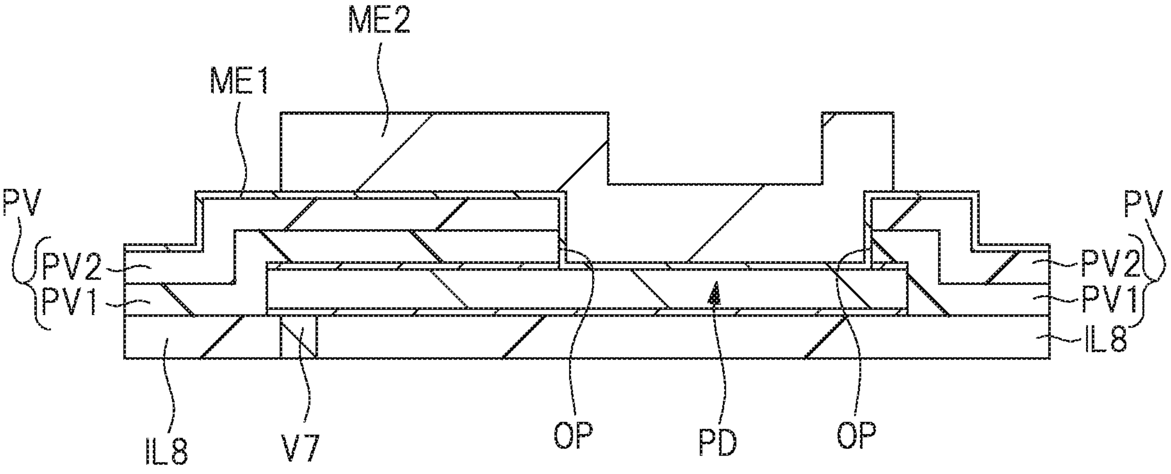
FIG. 21 is a cross-sectional view showing a principal part of the semiconductor device during the manufacturing process continued from FIG. 20.
Figure 22:
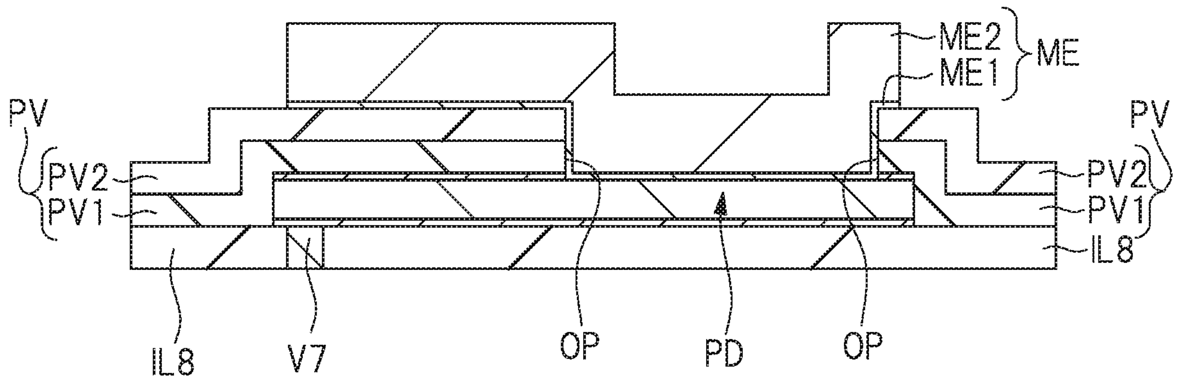
FIG. 22 is a cross-sectional view showing a principal part of the semiconductor device during the manufacturing process continued from FIG. 21.

Next, as shown in FIG. 21, the photoresist layer RP1 is removed. Thereafter, as shown in FIG. 22, the portion of the metal film ME1 exposed without being covered with the metal film ME2 is removed by etching or the like. In this way, the portion of the metal film ME1 exposed without being covered with the metal film ME2 is removed; however, the portion of the metal film ME1 covered with the metal film ME2, that is, the portion of the metal film ME1 located under the metal film ME2 remains without being removed.

In this way, as shown in FIG. 22, the metal film ME can be formed. The metal film ME is formed of the metal film ME2 and the metal film ME1 under the metal film ME2. Since the thickness of the metal film ME1 is smaller than the thickness of the metal film ME2, the metal film ME is mainly formed of the metal film ME2.

Moreover, here, the description has been given of the case of selectively forming the metal film ME2 in the opening portion OP1 of the photoresist layer RP1. As another mode, after the metal film ME1 is formed, the metal film ME2 is formed on the whole of the upper surface of the metal film ME1 without forming the photoresist layer RP1, and thereafter, a laminated film of the metal film ME1 and the metal film ME2 is patterned by using the photolithography technology and the etching technology, whereby the metal film ME can be formed.

As described above, a wafer process is implemented for the semiconductor substrate SB as shown in FIG. 11 to FIG. 22. The wafer process is also called a pre-process. Here, the wafer process generally refers to a process of forming a variety of elements (the MISFET and the like) wiring layers (here, the wirings M1 to M6) and pad electrodes (here, the pads PD) on the main surface of the semiconductor wafer (the semiconductor substrate SB), forming a surface protection film (here, the insulating film PV), and then achieving a state where an electrical test of each of a plurality of chip regions formed on the semiconductor wafer is enabled with the probe and the like. Each chip region of the semiconductor wafer corresponds to a region from which one semiconductor chip (here, the semiconductor device CP) is acquired in the semiconductor wafer.

Next, the probe inspection (probe test, wafer test) is performed using the metal film ME connected to the pad PD, whereby the electrical test of each chip region of the semiconductor wafer (semiconductor substrate SB) is performed. Specifically, in each chip region of the semiconductor wafer (semiconductor substrate SB), as shown in FIG. 9 mentioned above, the probe PRB for the inspection (test) is pressed against the probe contact region PA of the metal film ME to perform an electrical inspection (electrical test) of each chip region. In other words, the probe PRB is not brought into direct contact with the pad PD, but the probe PRB is brought into contact with the metal film ME (probe contact region PA), so that the probe PRB is electrically connected to the pad PD through the metal film ME and the electrical inspection (electrical test) of each chip region is performed. On the basis of a result of this probe inspection, it can be determined whether each chip region of the semiconductor wafer (semiconductor substrate SB) is acceptable or defective, or alternatively, data of a measurement result of the probe inspection is fed back to each manufacturing step, whereby yield and reliability of the semiconductor device can be enhanced. Note that each chip region of the semiconductor wafer corresponds to the region from which one semiconductor chip (semiconductor chip corresponding to the semiconductor device CP) is acquired in the semiconductor wafer.

Thereafter, a back surface of the semiconductor substrate SB is ground or polished according to needs to reduce the thickness of the semiconductor substrate SB (a back-grinding step), and then, the semiconductor substrate SB is diced (cut) together with the laminated structure on the semiconductor substrate SB (dicing step). At this time, the semiconductor substrate SB and the laminated structure on the semiconductor substrate SB are diced (cut) along a scribing region by a dicing blade (not shown). In this way, the semiconductor substrate SB and the laminated structure on the semiconductor substrate SB are divided (singulated) into the plurality of semiconductor chips.

In this way, the semiconductor device (semiconductor chip) CP can be manufactured.

Examination Example

Figure 23:
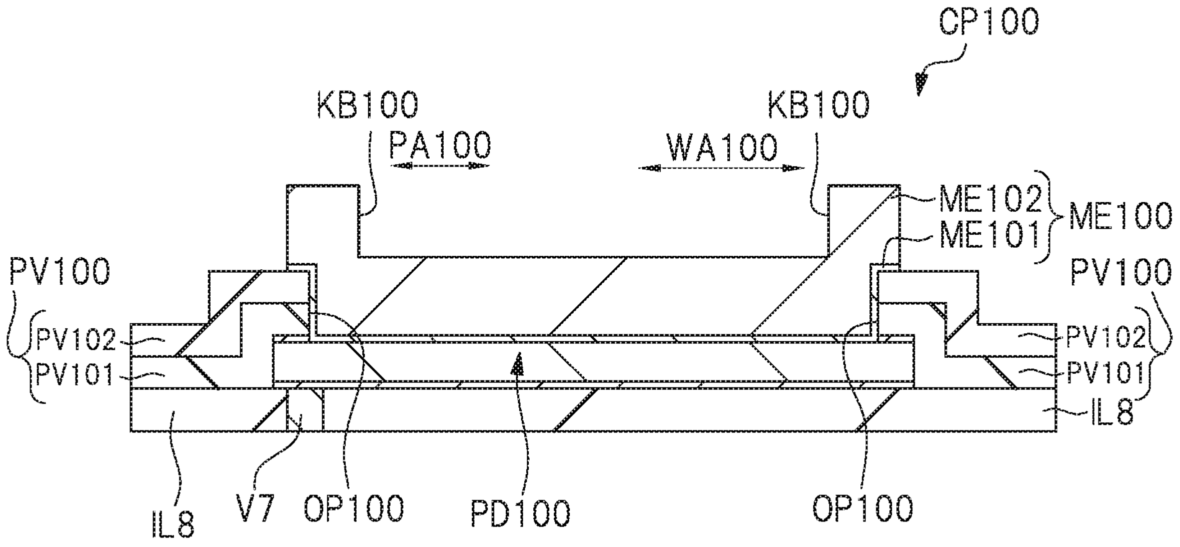
FIG. 23 is a cross-sectional view showing a principal part of a semiconductor device according to an examination example.
Figure 24:
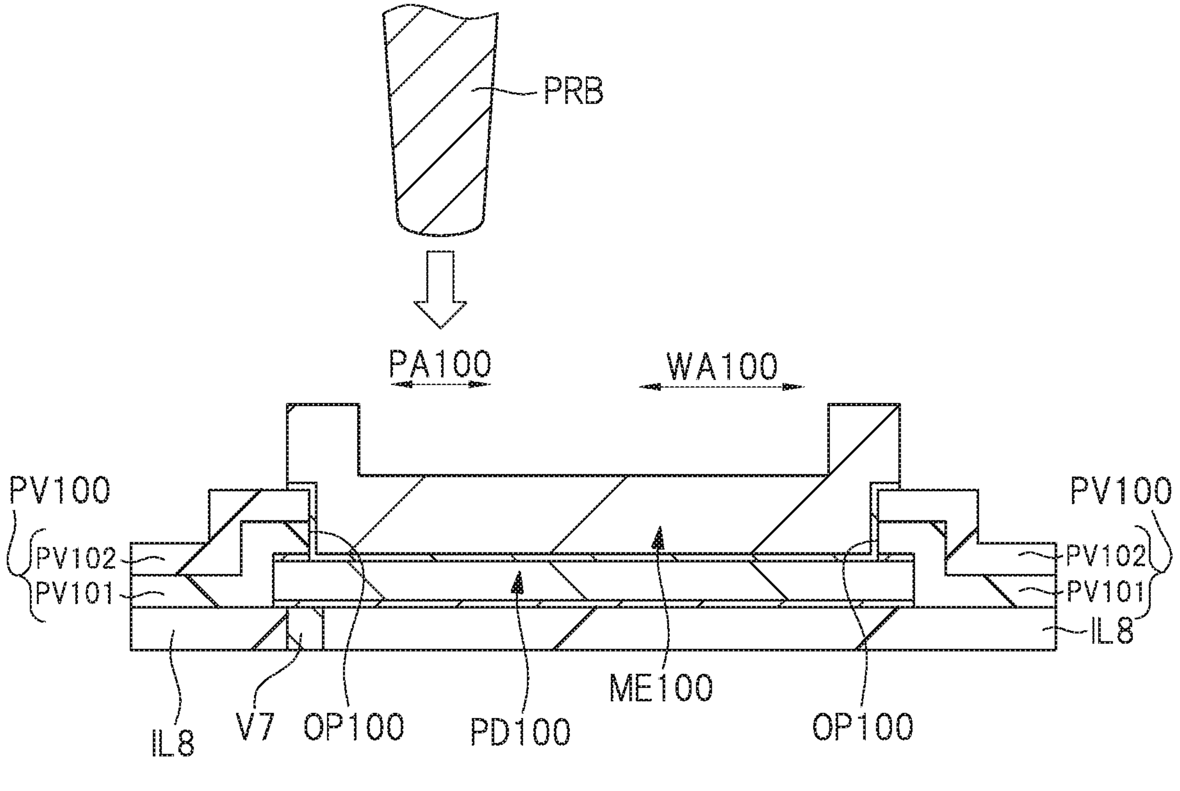
FIG. 24 is a cross-sectional view showing a state where the probe is brought into contact with a metal film shown in FIG. 23 at the time of the probe inspection.
Figure 25:
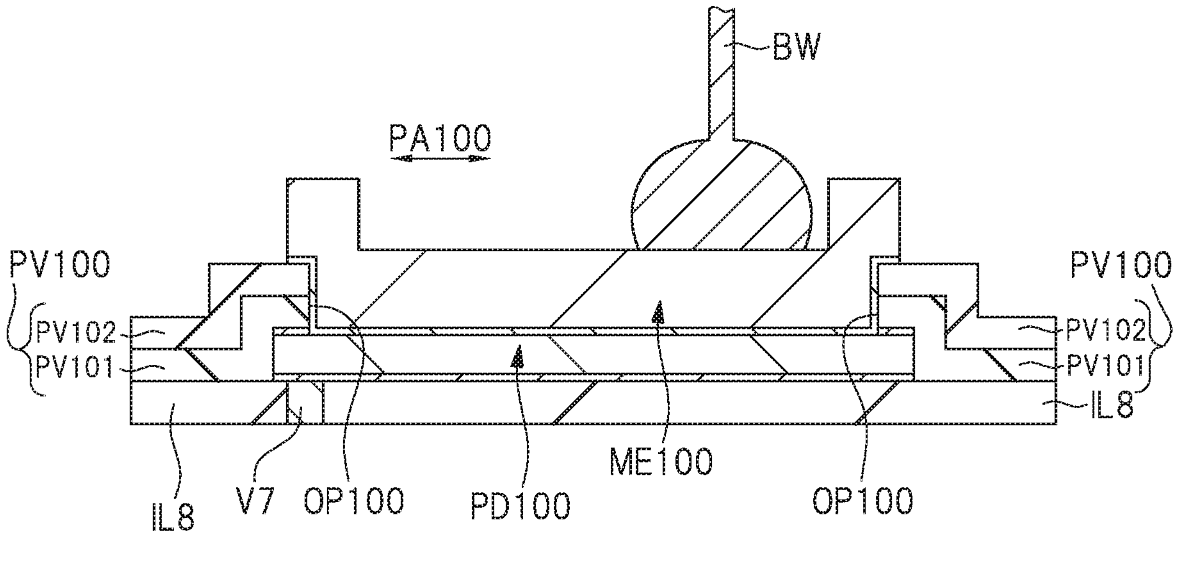
FIG. 25 is a cross-sectional view showing a state where the wire is bonded to the metal film shown in FIG. 23.
Figure 26:
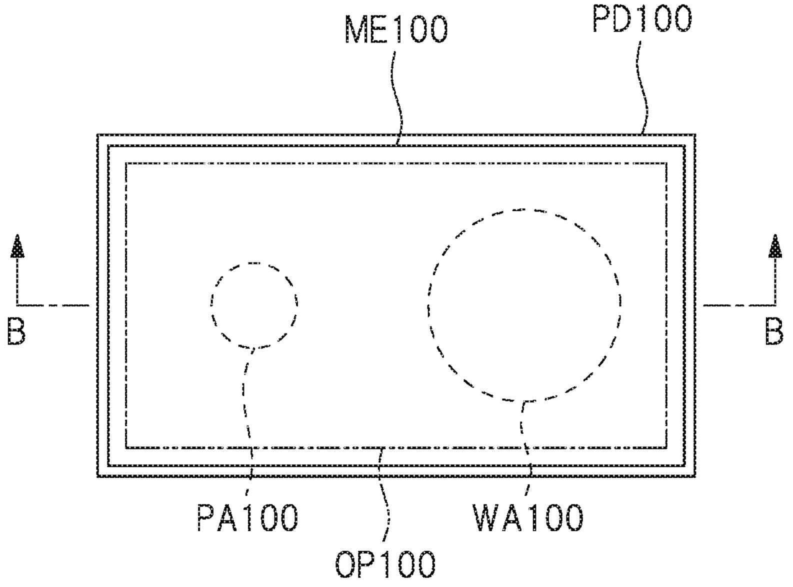
FIG. 26 is a plan view showing a principal part of the semiconductor device according to the examination example.

A description will be given of a semiconductor device (semiconductor chip) CP100 according to an examination example examined by the inventors of the present invention with reference to FIG. 23 to FIG. 26. FIG. 23 is a cross-sectional view showing a principal part of the semiconductor device CP100 according to the examination example examined by the inventors of the present invention, and corresponds to the above-mentioned FIG. 7 of the embodiment. Moreover, FIG. 24 is a cross-sectional view showing a state of bringing the probe PRB into contact with a probe contact region PA100 of a metal film ME100 in FIG. 23 at the time of the probe inspection, and corresponds to the above-mentioned FIG. 9. Furthermore, FIG. 25 is a cross-sectional view showing a state where the wire BW is bonded to a wire bonding region WA100 of the metal film ME100 in FIG. 23, and corresponds to the above-mentioned FIG. 10. In a similar way to FIG. 7, FIG. 9 and FIG. 10 mentioned above, illustration of a structure below the interlayer insulating film IL8 is omitted also in FIG. 23 to FIG. 25. Moreover, FIG. 26 is a plan view showing a principal part of the semiconductor device CP100 according to the examination example, and corresponds to the above-mentioned FIG. 8. A pad PD100 and the metal film ME100 shown in the cross-sectional views of FIG. 23 to FIG. 25 substantially correspond to a cross-sectional view taken at a position of line B-B of FIG. 26.

In the semiconductor device CP100 according to the examination example, though a plane dimension (plane area) of the pad PD100 corresponding to the above-described pad PD is substantially equal to that of the above-described pad PD, a plane dimension of an opening portion OP100 of an insulating film PV100, which exposes the pad PD100, is considerably larger than the plane dimension of the above-described opening portion OP of the above-described insulating film PV, and most of the pad PD100 is exposed from the opening portion OP100 of the insulating film PV100. The insulating film PV100 corresponds to the insulating film PV, and is composed of, for example, a laminated film of an insulating film PV101 corresponding to the above-described insulating film PV1 and an insulating film PV102 corresponding to the above-described insulating film PV2.

In the semiconductor device CP100 according to the examination example, the metal film ME100 corresponding to the above-described metal film ME is formed on the pad PD100 exposed from the opening portion OP100 of the insulating film PV100. The metal film ME100 is composed of a laminated film of a metal film ME101 corresponding to the above-described metal film ME1 and a metal film ME102 formed on the metal film ME101 and corresponding to the above-described metal film ME2. Around the opening portion OP100, the metal film ME100 slightly hangs on the insulating film PV100; however, a plane dimension of the portion of the metal film ME100 located on the insulating film PV100 is considerably smaller than a plane dimension of the portion of the above-described metal film ME located on the insulating film PV.

In the semiconductor device CP according to the embodiment, the wire bonding region WA is included in the opening portion OP of the insulating film PV as mentioned above, and the probe contact region PA does not overlap the opening portion OP of the insulating film PV, but overlaps the insulating film PV. That is, in the semiconductor device CP according to the embodiment described above, as shown in the above-mentioned FIG. 10, the wire BW is bonded to the portion of the metal film ME located on the pad PD exposed from the opening portion OP of the insulating film PV, and the probe PRB contacts the portion of the metal film ME located on the insulating film PV in the probe inspection and the probe mark is formed thereon as shown in the above-mentioned FIG. 9.

Unlike the semiconductor device CP according to the embodiment described above, in the semiconductor device CP100 according to the examination example, both of the wire bonding region WA100 corresponding to the above-described wire bonding region WA and the probe contact region PA100 corresponding to the above-described probe contact region PA are included in the opening portion OP100 of the insulating film PV100.

That is, in the case of the semiconductor device CP100 according to the examination example, as shown in FIG. 24, the probe PRB contacts the portion of the metal film ME100 located on the pad PD100 exposed from the opening portion OP100 of the insulating film PV100 in the probe inspection step, and the probe mark is formed. Furthermore, in the case of the semiconductor device CP100 according to the examination example, as shown in FIG. 25, the wire BW is bonded to the portion of the metal film ME100 located on the pad PD100 exposed from the opening portion OP100 of the insulating film PV100 in the wire bonding step.

As a result of the examination of the inventors of the present invention, it has been found out that the following problems occur in the case of the examination example in FIG. 23 to FIG. 26.

That is, since the probe PRB is pressed against the probe contact regions PA and PA100 of the metal films ME and ME100 in the probe inspection step, this probe PRB applies a strong external force (pressure) to the probe contact regions PA and PA100 of the metal films ME and ME100. In the case of the semiconductor device CP100 according to the examination example, the external force (pressure) applied to the probe contact region PA100 of the metal film ME100 is transmitted from the metal film ME100 to the pad PD100 located thereunder, causing an apprehension that the pad PD100 may be deformed. Moreover, the external force (pressure) is also transmitted to the insulating film (here, the insulating film IL8) located under the pad PD100, also causing an apprehension to adversely affect the insulating film located under the pad PD100. For example, it is apprehended that a crack may occur in the insulating film (interlayer insulating film IL8) located under the pad PD100. When the crack occurs in the insulating film (interlayer insulating film IL8) located under the pad PD100, conduction between the pad PD100 and the wiring M6, which are originally insulated from each other, is concerned. Accordingly, it is apprehended that the reliability of the semiconductor device may decrease (the conduction which is caused by the crack needs to be prevented also between the respective wiring layers which are insulated from one another). Besides, it is apprehended that moisture may enter from the crack to lower the reliability of the semiconductor device. Moreover, it is apprehended that the pad PD100 may be delaminated from the crack as a starting point due to a thermal stress after the semiconductor package is manufactured, thereby lowering the reliability of the semiconductor device. Moreover, it is apprehended that deformation of the pad PD100 may lead to the decrease of the reliability of the semiconductor device.

Therefore, in order to enhance the reliability of the semiconductor device, it is desired that the pad and the insulating film located under the pad be prevented from being adversely affected even if the probe is brought into contact with the metal film connected to the pad in the probe inspection.

<Main Features and Effects>

The semiconductor device CP according to this embodiment includes: the semiconductor substrate SB; the interlayer insulating film IL8 (first interlayer insulating film) formed on the semiconductor substrate SB; the pad PD formed on the interlayer insulating film IL8; the insulating film PV (second insulating film) formed on the interlayer insulating film IL8 so as to cover the pad PD; and the opening portion OP that is formed in the insulating film PV and exposes a part of the pad PD. The semiconductor device CP according to this embodiment further includes the metal film ME which is formed on the pad PD exposed from the opening portion OP and on the insulating film PV and is electrically connected to the pad PD. The metal film ME integrally includes the first portion MEa located on the pad PD exposed from the opening portion OP and the second portion MEb located on the insulating film PV.

One of main features of this embodiment is that the upper surface of the metal film ME has the wire bonding region WA (first region) for bonding the wire to the metal film ME and the probe contact region PA (second region) for bringing the probe into contact with the metal film ME, the wire bonding region WA is located on the first portion MEa of the metal film ME, and the probe contact region PA is located on the second portion MEb of the metal film ME. In this way, it is possible to suppress or prevent the external force (pressure) applied from the probe to the probe contact region PA of the metal film ME at the time of the probe inspection from adversely affecting the pad PD and the insulating film located below the pad PD, and the reliability of the semiconductor device can be enhanced. Hereinafter, this will be specifically described.

In the case of the examination example in FIGS. 23 to 26 mentioned above, not only the wire bonding region WA100 but also the probe contact region PA100 is located on the metal film ME100 on the pad PD100 exposed from the opening portion OP100. Therefore, the external force (pressure) applied from the probe PRB to the probe contact region PA100 of the metal film ME100 at the time of the probe inspection is prone to be transmitted from the metal film ME100 to the pad PD100 located thereunder, and further, is also prone to be transmitted to the insulating film under the pad PD100. Accordingly, it is apprehended that the external force (pressure) may adversely affect the pad PD100 and the insulating film under the pad PD100.

In contrast, in this embodiment, the metal film ME integrally includes the first portion MEa located on the pad PD exposed from the opening portion OP of the insulating film PV and the second portion MEb located on the insulating film PV, and the probe contact region PA is located on the second portion MEb of the metal film ME. Therefore, below the probe contact region PA, the metal film ME, the insulating film PV, the pad PD and the interlayer insulating film IL8 are present in this order, and the insulating film PV is interposed between the pad PD and the metal film ME below the probe contact region PA. Therefore, the external force (pressure) applied from the probe PRB to the probe contact region PA of the metal film ME at the time of the probe inspection is transmitted from the metal film ME to the insulating film PV located thereunder, but is transmitted to the pad PD after being buffered or blocked to some extent by this insulating film PV. The external force (pressure) transmitted to the pad PD located under the probe contact region PA is reduced by the amount buffered or blocked by the insulating film PV, and the external force (pressure) transmitted to the insulating film (here, the interlayer insulating film IL8) located under the pad PD is further reduced.

That is, if it is assumed that the external forces (pressures) applied from the probe PRB to the probe contact regions PA and PA100 of the metal films ME and ME100 at the time of the probe inspection are identical to each other between this embodiment and the above-described examination example, the external force (pressure) transmitted to the pad and the interlayer insulating film IL8 located thereunder is reduced in this embodiment compared with the examination example because the external force (pressure) is buffered or blocked by the insulating film PV in this embodiment.

Therefore, in this embodiment, it is possible to suppress or prevent the external force (pressure) applied from the probe PRB to the probe contact region PA of the metal film ME at the time of the probe inspection from adversely affecting the pad PD and the insulating film below the pad PD. For example, it is possible to suppress or prevent the deformation of the pad PD, and it is possible to suppress or prevent the occurrence of the crack in the insulating film (interlayer insulating film IL8) below the pad PD. Hence, the reliability of the semiconductor device can be enhanced.

Moreover, in the above-described examination example, it is also conceivable to thicken the pad PD100 and the metal film ME100 for the purpose of preventing the external force (pressure) from the probe PRB from adversely affecting the interlayer insulating film IL8 located under the pad PD100 at the time of the probe inspection. If the pad PD100 and the metal film ME100 are thickened, the external force (pressure) applied from the probe PRB to the probe contact region PA100 of the metal film ME100 at the time of the probe inspection is likely to be buffered by the metal film ME100 and the pad PD100, and accordingly, the external force (pressure) becomes difficult to be transmitted to the interlayer insulating film IL8 located under the pad PD100.

However, by thickening the pad PD100 in the above-described examination example, the pad PD100 becomes prone to be deformed in a curing stage (cooling stage) of the sealing resin in the molding step (corresponding to the above-described Steps S4 and S14) when manufacturing the semiconductor package, and the crack becomes prone to occur in the insulating film PV100 due to the deformation of the pad PD100. Therefore, it is not very advisable to thicken the pad PD100 in the above-described examination example.

Moreover, it is apprehended that fluctuations (deviations from a design value) of the thickness of the metal film ME100 may be increased by thickening the metal film ME100 in the above-described examination example. However, since it is necessary to set conditions of the wire bonding step in accordance with the thickness of the metal film ME100 to which the wire BW is connected, it is desirable that the thickness of the metal film ME100 does not deviate from the design value as much as possible. Moreover, it is apprehended that thickening the metal film ME100 leads to the increase in the manufacturing cost of the semiconductor device, and thickening the metal film ME100 greatly affects the increase in the manufacturing cost particularly when the metal film ME100 contains a noble metal film such as a gold film. Therefore, it is not very advisable to thicken the metal film ME100 in the above-described examination example.

In contrast, in this embodiment, the insulating film PV is interposed between the metal film ME and the pad PD below the probe contact region PA. Therefore, in comparison with the above-described examination example, a distance from the probe contact region PA on the upper surface of the metal film ME to the upper surface of the interlayer insulating film IL8 under the pad PD can be increased by the amount of the thickness of the insulating film PV in this embodiment. In other words, in this embodiment, even if the pad PD and the metal film ME are not thickened, since the insulating film PV is allowed to be present below the probe contact region PA, it is possible to increase a distance from a tip end of the probe PRB to the upper surface of the interlayer insulating film IL8 located under the pad PD when the probe PRB is pressed against the probe contact region PA of the metal film ME. In this way, even if the pad PD and the metal film ME are not thickened, the external force (pressure) applied from the probe PRB to the probe contact region PA of the metal film ME at the time of the probe inspection is less likely to be transmitted to the interlayer insulating film IL8 located under the pad PD. Accordingly, it is possible to suppress or prevent the interlayer insulating film IL8 located under the pad PD from being adversely affected. Hence, it is possible to prevent the occurrence of the crack or the like in the interlayer insulating film IL8 located under the pad PD at the time of the probe inspection, while avoiding such an adverse effect mentioned above which may occur when the pad PD and the metal film ME are thickened too much.

Moreover, in this embodiment, the wire bonding region WA is not located on the second portion MEb of the metal film ME on the insulating film PV, but is located on the first portion MEa of the metal film ME on the pad PD exposed from the opening portion OP of the insulating film PV. Unlike this embodiment, when the wire BW is bonded to the second portion MEb of the metal film ME located on the insulating film PV, the insulating film PV is interposed between the metal film ME and the pad PD below the wire BW. Accordingly, a conduction path from the wire BW to the pad PD is elongated, and a resistance (electrical resistance) between the wire BW and the pad PD is increased. In contrast, in this embodiment, the wire is bonded to the first portion MEa of the metal film ME located on the pad PD exposed from the opening portion OP of the insulating film PV. Accordingly, the conduction path from the wire BW to the pad PD can be shortened, and the resistance (electrical resistance) between the wire BW and the pad PD can be suppressed. Hence, performance of the semiconductor device can be enhanced.

Meanwhile, in this embodiment, since the probe PRB is brought into contact with the second portion MEb on the metal film ME located on the insulating film PV at the time of the probe inspection, a resistance from the probe PRB to the pad PD is increased. However, this increase does not affect actual use of the semiconductor device CP, and accordingly, is not regarded as a problem. When the manufactured semiconductor device CP is actually used, the second portion MEb on the insulating film PV does not need to function as a conduction path of a signal, and it is the first portion MEa of the metal film ME that functions as the conduction path of the signal, that is, the conduction path between the wire BW and the pad PD.

As described above, in this embodiment, the metal film ME is formed on the pad PD exposed from the opening portion OP of the insulating film PV and on the insulating film PV, and the probe PRB is brought into contact with the second portion MEb of this metal film ME located on the insulating film PV in the probe inspection, and the wire BW is bonded to the first portion MEa located on the pad PD exposed from the opening portion OP in the wire bonding step. In this way, the wire BW and the pad PD can be electrically connected to each other through the metal film ME with a low resistance, and in addition, it is possible to prevent the external force (pressure) from the probe PRB from adversely affecting the pad PD and the interlayer insulating film IL8 located under the pad PD at the time of the probe inspection.

Moreover, in comparison with the manufacturing process of the semiconductor device CP100 according to the above-described examination example, the manufacturing process of the semiconductor device CP according to this embodiment does not need to increase the number of manufacturing steps. Accordingly, the number of manufacturing steps of the semiconductor device can be suppressed, and the manufacturing cost of the semiconductor device can be suppressed.

Moreover, the insulating film PV present under the metal film ME has a function to suppress or block the transmission of the external force (pressure), which is applied from the probe PRB to the probe contact region PA of the metal film ME at the time of the probe inspection, to the pad PD and the interlayer insulating film IL8 located under the pad PD, and a magnitude of this function is changeable depending on the material of the insulating film PV. Therefore, it is more preferable to select the material of the insulating film PV so as to increase this function, and the insulating film PV preferably includes a hard material film from this viewpoint.

Therefore, the insulating film PV preferably includes an inorganic insulating film, that is, is preferably a single-layer film of an inorganic insulating film or a laminated film of an inorganic insulating film. In other words, it is preferable that the insulating film PV is an inorganic insulating film or a laminated film including an inorganic insulating film. Since the inorganic insulating film is a relatively hard material film, the inorganic insulating film has a large function to suppress or block the transmission of the external force (pressure). When the insulating film PV includes the inorganic insulating film, it is possible to more accurately suppress the external force (pressure) applied from the probe PRB to the probe contact region PA of the metal film ME at the time of the probe inspection from being transmitted to the pad PD and the interlayer insulating film IL8 located under the pad PD, and the deformation of the pad PD and the occurrence of crack of the interlayer insulating film IL8 located under the pad PD can be more accurately suppressed or prevented.

Moreover, among such inorganic insulating films, a silicon nitride film is particularly hard, and accordingly, has a particularly large function to suppress or block the transmission of the external force (pressure). Therefore, the insulating film PV more preferably includes a silicon nitride film, that is, is more preferably a single-layer film or a laminated film including a silicon nitride film. In other words, it is more preferable that the insulating film PV is a silicon nitride film or the laminated film including a silicon nitride film. When the insulating film PV includes a silicon nitride film, it is possible to further accurately suppress the external force (pressure) applied from the probe PRB to the probe contact region PA of the metal film ME at the time of the probe inspection from being transmitted to the pad PD and the interlayer insulating film IL8 located under the pad PD, and the deformation of the pad PD and the occurrence of crack of the interlayer insulating film IL8 located under the pad PD can be further accurately suppressed or prevented.

As the insulating film PV, a laminated film of a silicon nitride film and a silicon oxide film located on the silicon nitride film can be particularly suitably used. In this case, in FIG. 7, the insulating film PV is composed of the laminated film of the insulating film PV1 made of a silicon nitride film and the insulating film PV2 formed on the insulating film PV1 and made of a silicon oxide film. In this way, the function of the insulating film PV as the passivation film can be enhanced, and further an effect of suppressing the external force (pressure), which is applied from the probe PRB to the probe contact region PA of the metal film ME at the time of the probe inspection, from being transmitted to the pad PD and the interlayer insulating film IL8 under the pad PD can also be enhanced.

Moreover, in this embodiment, the following effects can also be obtained.

Figure 27:
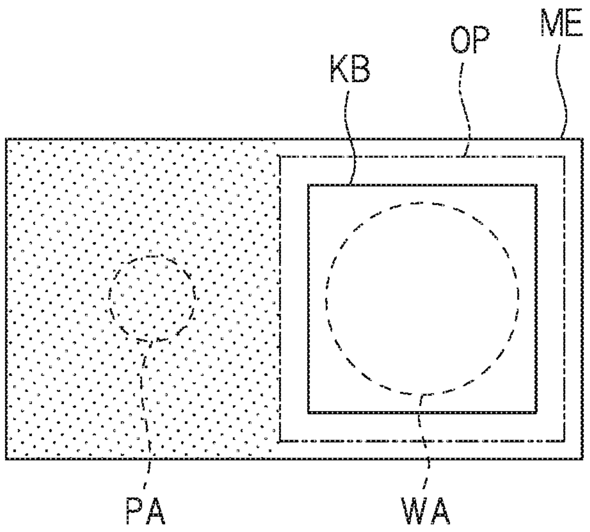
FIG. 27 is a plan view showing a principal part of the semiconductor device according to one embodiment.
Figure 28:
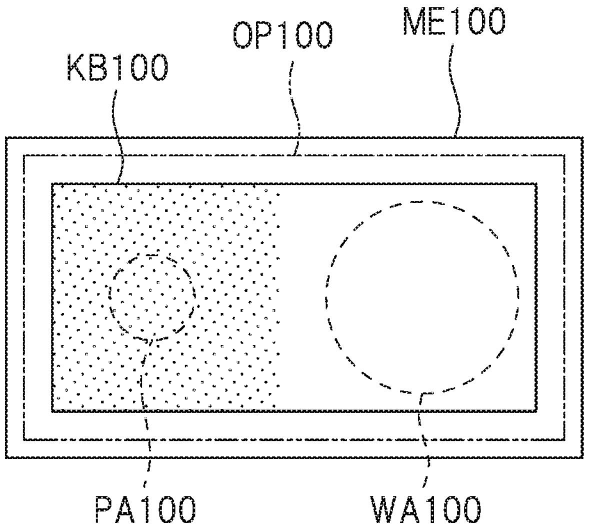
FIG. 28 is a plan view showing a principal part of the semiconductor device according to the examination example.

FIG. 27 is a plan view showing a principal part of the semiconductor device CP according to this embodiment, and a plan view of the metal film ME is shown. Moreover, FIG. 28 is a plan view showing a principal part of the semiconductor device CP100 according to the examination example, and a plan view of the metal film ME100 is shown. In FIG. 27 and FIG. 28, each of the metal films ME and ME100 and dents KB and KB100 is indicated by a solid line, each of the opening portions OP and OP100 of the insulating films PV and PV100 is indicated by a chain double-dashed lines, each of the wire bonding regions WA and WA100 and the probe contact regions PA and PA100 is indicated by a broken line (dotted line), and the illustration of the pads PD and PD100 is omitted. In FIG. 27, the solid line denoted by reference symbol KB is a position of a sidewall of the dent KB in the metal film ME, and in FIG. 28, the solid line denoted by reference symbol KB100 is a position of a sidewall of the dent KB100 in the metal film ME100.

In the case of the above-described examination example, the wire bonding region WA100 and the probe contact region PA100 are included in the opening portion OP100 in plan view. That is, in the metal film ME100, the dent (dent portion, recessed portion) KB100 formed by the opening portion OP100 of the insulating film PV100 is present (refer to FIG. 23 and FIG. 28). Furthermore, the wire bonding region WA100 and the probe contact region PA100 are present on a bottom surface of the dent KB100 in the metal film ME100, the probe PRB is brought into contact with the bottom surface of the dent KB100 at the time of the probe inspection, and the wire BW is bonded thereto at the time of the wire bonding.

However, as can be seen from FIG. 23 and FIG. 28, a plane dimension of the dent KB100 becomes smaller than the plane dimension of the opening portion OP100 of the insulating film PV approximately by the amount of the thickness of the metal film ME100. Moreover, on the upper surface of the metal film ME100, a region near a sidewall of the dent KB100 (that is, a step difference portion of the metal film ME100) is a region with which it is difficult to bring the probe PRB into contact, and accordingly, the probe contact region PA100 needs to be separated to some extent from the sidewall of the dent KB100. Therefore, in the case of the examination example, when the plane dimension of the dent KB100 is attempted to be ensured so that both of the wire bonding region WA100 and the probe contact region PA100 can be disposed therein, the plane dimension of the opening portion OP100 becomes considerably large, with the result that the plane dimension of the metal film ME100 also becomes considerably large. It is apprehended that this may cause the increase in the plane dimension of the semiconductor device CP100.

In contrast, in this embodiment, the dent (dent portion, recessed portion) KB formed by the opening portion OP of the insulating film PV is present in the first portion MEa of the metal film ME, the wire bonding region WA is present on a bottom surface of the dent KB, and the wire BW is bonded to the bottom surface of the dent KB at the time of the wiring bonding (refer to FIG. 7, FIG. 10 and FIG. 27). Meanwhile, the second portion MEb of the metal film ME is located on the insulating film PV, and the dent caused by the opening portion OP of the insulating film PV is not formed in the second portion MEb of the metal film ME. Therefore, an upper surface of the second portion MEb of the metal film ME becomes substantially flat, and it becomes easy to dispose the probe contact region PA. From another viewpoint, it is possible to dispose the probe contact region PA in any region on the upper surface of the second portion MEb of the metal film ME. In other words, even if the plane dimension (plane area) of the second portion MEb of the metal film ME is not increased to a large extent, the probe contact region PA can be accurately ensured on the upper surface of the second portion MEb of the metal film ME.

Therefore, when the case of the above-described examination example (FIG. 28) and the case of this embodiment (FIG. 27) are compared with each other, if it is assumed that the plane dimensions of the metal films ME and ME100 are identical to each other, the size of plane region (flat region) of the metal film ME where it is possible to dispose the probe contact region PA in the case of this embodiment (FIG. 27) is larger than the size of plane region (flat region) of the metal film ME100 where it is possible to dispose the probe contact region PA100 in the case of the above-described examination example (FIG. 28). Note that, in FIG. 27 and FIG. 28, the plane regions (flat regions) of the metal films ME and ME100 where it is possible to dispose the probe contact regions PA and PA100 are shown by shading with dots. Therefore, it becomes easier to perform the probe inspection in this embodiment than in the above-described examination example. From another viewpoint, the metal film ME according to this embodiment can reduce the whole plane dimension (that is, the plane dimension of the metal film) more while enabling more appropriate implementation of the probe inspection and the wire bonding compared with the metal film ME100 according to the above-described examination example. Therefore, this embodiment becomes more advantageous in miniaturization (area reduction) of the semiconductor device (semiconductor chip) than the above-described examination example.

Next, each thickness of the pad PD, the insulating film PV and the metal film ME will be described.

When the pad PD is thickened, the pad PD becomes prone to be deformed in the curing stage (cooling stage) of the sealing resin in the molding step (corresponding to the above-described Steps S4 and S14) when manufacturing the semiconductor package, and the crack becomes prone to occur in the insulating film PV due to the deformation of the pad PD. Therefore, it is desirable that the pad PD should not be thickened too much. Meanwhile, the insulating film PV has a function to suppress or block the transmission of the external force (pressure) generated by the probe PRB, and a magnitude of the function is increased as the insulating film PV is thickened. Therefore, it is desirable that the insulating film PV be thickened to some extent. Therefore, preferably, a thickness T1 of the insulating film PV is larger than a thickness T2 of the pad PD (that is, T1>T2). In this way, while suppressing or preventing the deformation of the pad PD in the molding step (corresponding to the above-described Steps S4 and S14) when manufacturing the semiconductor package, the effect of preventing the external force (pressure) from the probe PRB at the time of the probe inspection from adversely affecting the pad PD and the interlayer insulating film IL8 located under the pad PD can be enhanced.

Meanwhile, if the metal film ME is thinned too much, it becomes difficult to bond the wire BW thereto, and the wire BW is likely to be bonded well to the metal film ME when the metal film ME has some thickness. Therefore, preferably, a thickness T3 of the metal film ME is larger than the thickness T2 of the pad PD (that is, T3>T2). In this way, the wire BW can be bonded well to the metal film ME while suppressing or preventing the deformation of the pad PD in the molding step (corresponding to the above-described Steps S4 and S14) when manufacturing the semiconductor package.

Note that the thickness T1 (refer to FIG. 7) of the insulating film PV corresponds to a thickness of the insulating film PV in the portion sandwiched by the metal film ME and the pad PD. Moreover, the thickness T2 (refer to FIG. 7) of the pad PD corresponds to a thickness of the pad PD in the portion covered with the insulating film PV. Moreover, the thickness T3 (refer to FIG. 7) of the metal film ME corresponds to a thickness of the second portion MEb in the portion located on the insulating film PV.

FIG. 29 and FIG. 30 are tables showing results of investigating the damage caused on the interlayer insulating film under the pad by the probe inspection. FIG. 29 shows results of investigating whether some damage occurs on the insulating film located under the pad PD after the probe is repeatedly pressed against the probe contact region PA of the metal film ME in the case of adopting the structure (FIG. 7) according to this embodiment. Moreover, FIG. 30 shows results of investigating whether some damage occurs on the insulating film located under the pad PD100 after the probe is repeatedly pressed against the probe contact region PA100 of the metal film ME100 in the case of adopting the structure (FIG. 23) according to the above-described examination example. Magnitude of force with which the probe is pressed against the metal films ME and ME100 is listed as "stylus pressure" in each table of FIG. 29 and FIG. 30. Moreover, the number of times that the probe is pressed against the metal films ME and ME100 is listed as "number of contacts" in each table of FIG. 29 and FIG. 30. The number of samples is set to 50 (N=50). Furthermore, the case where the sample in which the damage (crack or the like) occurred in the insulating film located under the pad was not found among the 50 samples is indicated by a circle mark "0". Also, the case where one or more samples in which the damage (crack or the like) occurred in the insulating film located under the pad were found among the 50 samples is indicated by a cross mark (x).

As shown in FIG. 30, when the structure (FIG. 23) according to the above-described examination example was adopted, the damage was prone to occur on the insulating film located under the pad PD 100 if the stylus pressure of the probe was increased, that is, if the external force applied from the probe to the metal film ME100 was increased. Moreover, when the number of times that the probe was pressed against the metal film ME100 (the number of contacts) was increased, the damage was prone to occur on the insulating film located under the pad PD100.

In contrast, when the structure (FIG. 7) according to this embodiment was adopted, the damage hardly occurred on the insulating film located under the pad PD even if the stylus pressure of the probe was increased and the number of times that the probe was pressed against the metal film ME (the number of contacts) was increased as shown in FIG. 29. It is conceivable that this is because the insulating film PV present under the metal film ME suppressed or blocked the external force (pressure), which was applied from the probe to the probe contact region PA of the metal film ME, from being transmitted to the region below the insulating film PV. Hence, by adopting the structure (FIG. 7) according to this embodiment, it is possible to prevent a defect from occurring on the insulating film located under the pad PD in the probe inspection.

<Modification>

Figure 31:
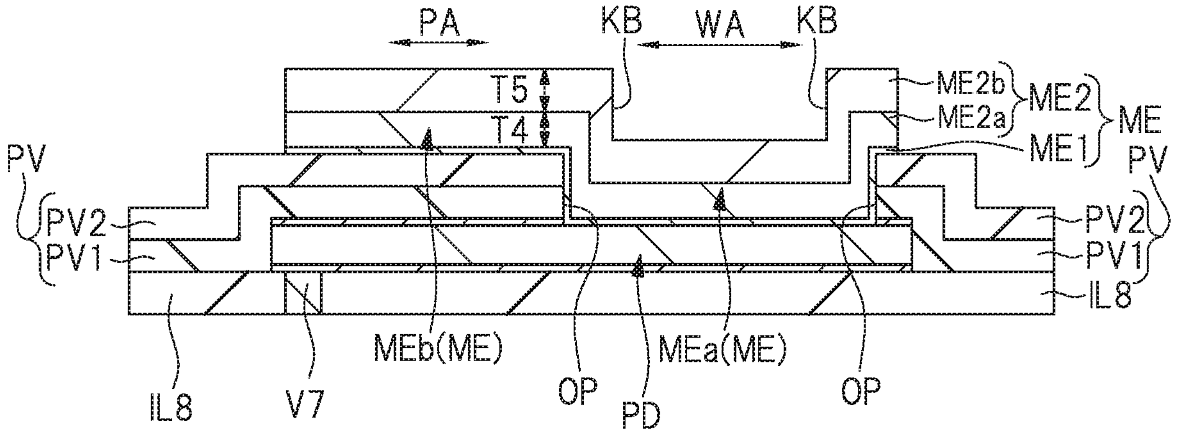
FIG. 31 is a cross-sectional view showing a principal part of a semiconductor device according to a modification.
Figure 32:
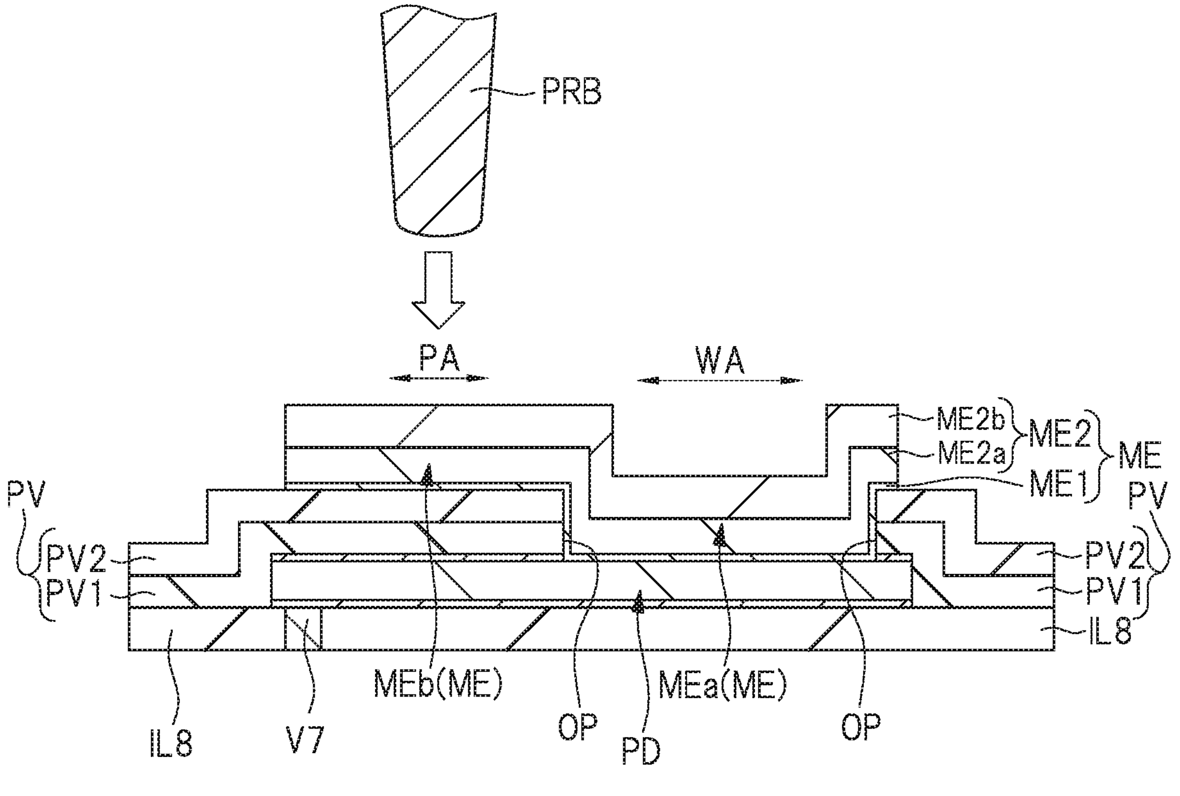
FIG. 32 is a cross-sectional view showing a state where the probe is brought into contact with a metal film shown in FIG. 31 at the time of the probe inspection.
Figure 33:
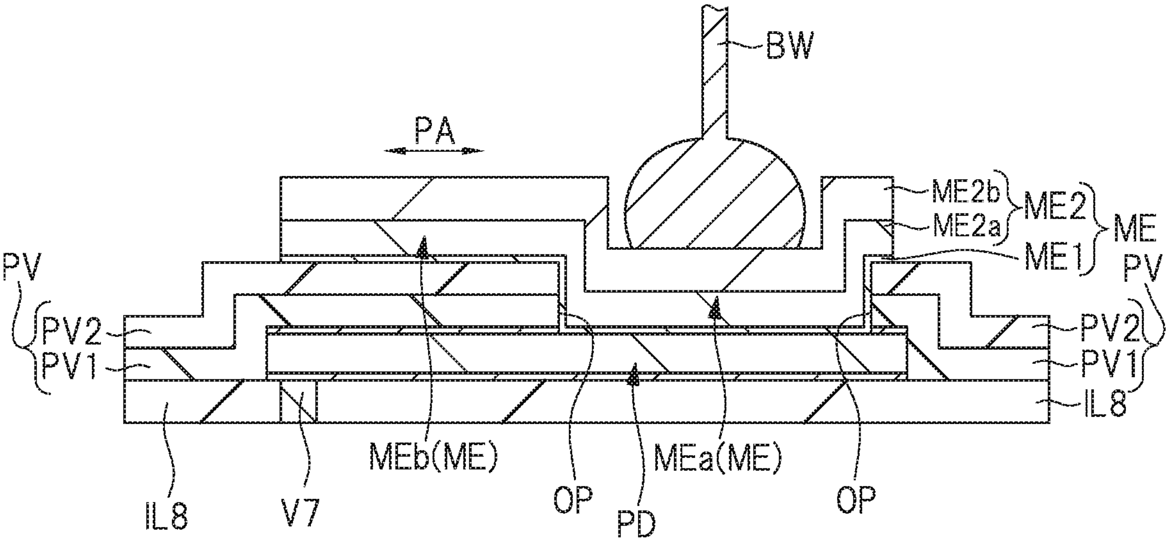
FIG. 33 is a cross-sectional view showing a state where the wire is bonded to the metal film shown in FIG. 31.

FIG. 31 is a cross-sectional view showing a principal part of a modification of the semiconductor device CP according to this embodiment, and a cross-sectional view corresponding to FIG. 7 mentioned above is shown. Moreover, FIG. 32 is a cross-sectional view showing a state of bringing the probe PRB into contact with the probe contact region PA of the metal film ME in FIG. 31 at the time of the probe inspection, and corresponds to the above-mentioned FIG. 9. Furthermore, FIG. 33 is a cross-sectional view showing a state where the wire BW is bonded to the wire bonding region WA of the metal film ME in FIG. 31, and corresponds to the above-mentioned FIG. 10. In a similar way to FIG. 7, FIG. 9 and FIG. 10 are mentioned above, illustration of a structure below the interlayer insulating film IL8 is omitted also in FIG. 31 to FIG. 33. Moreover, similarly to the above-mentioned FIG. 10, illustration of the sealing resin is omitted also in FIG. 33.

The modification in FIG. 31 is different from this embodiment in FIG. 7 mentioned above in a film structure of the metal film ME. In the case of the modification in FIG. 31, the metal film ME2 of the metal films ME1 and ME2 which constitute the metal film ME is composed of a laminated film of a nickel (Ni)) film ME2*a* and a gold (Au) film ME2*b* located on the nickel film ME2*a*. In this case, the metal film ME is composed of a laminated film of the metal film ME1, the nickel film ME2*a* located on the metal film ME1, and the gold film ME2*b* located on the nickel film ME2*a*, and the uppermost layer of the metal film ME is the gold film ME2*b*. In other words, the metal film ME is composed of the laminated film including the nickel film ME2*a* and the gold film ME2*b* located on the nickel film ME2*a*, and the uppermost layer of this laminated film is the gold film ME2*b*. Each of the nickel film ME2*a* and the gold film ME2*b* is formed by the electroplating method, and is a plated film (electroplated film). In this case, for example, a single-layer film of titanium (Ti) or a laminated film of a titanium (Ti) film and a copper (Cu) film located on the titanium film can be suitably used as the metal film ME1 to be used as the seed layer. Moreover, the copper (Cu) film can be formed not as the seed layer (ME1) but by the electroplating method.

In this case, the copper film as the electroplated film is formed on the seed layer (for example, a titanium film), and the nickel film ME2*a* and the gold film ME2*b* are formed on the copper film in order from the bottom, whereby the metal film ME is formed.

In the wire bonding, the wire can be bonded well if the wire is bonded to the gold film. Therefore, the gold film is particularly suitable as the uppermost layer of the metal film ME. Therefore, in the case of FIG. 7 mentioned above, it is truly preferable that a gold film is used as the metal film ME2 that constitutes the uppermost layer of the metal film ME and the wire BW is bonded to the gold film (ME2) (refer to FIG. 10). Meanwhile, in the case of the modification in FIG. 31, the gold film ME2*b* is used as the uppermost layer of the metal film ME, and the wire BW is bonded to the gold film ME2*b* (refer to FIG. 33). In this way, when the wire BW is bonded to the gold film ME2*b* of the metal film ME as shown in FIG. 33, the wire BW can be bonded well.

In addition, in the case of the modification in FIG. 31, the nickel film ME2*a* is provided under the gold film ME2*b*, so that the following effect can be further obtained.

That is, since nickel is a hard material, the hard nickel film ME2*a* can also have a function to suppress or block the external force (pressure), which is applied to the gold film ME2*b* by the probe PRB, from being transmitted to the regions under the metal film ME. In other words, since the gold film is relatively soft, the external force (pressure) applied to the upper surface of the gold film ME2*b* by the probe PRB is transmitted to the nickel film ME2*a* located under the gold film ME2*b* without being buffered very much by the gold film ME2*b*. Meanwhile, since the nickel film ME2*a* is hard (harder than the gold film ME2*b*), the external force (pressure) transmitted to the nickel film ME2*a* is buffered or blocked to a considerable extent by the nickel film ME2*a*, and is then transmitted to the insulating film PV. Thereafter, the external force (pressure) transmitted to the insulating film PV is buffered or blocked by the insulating film PV. Therefore, in the case of the modification in FIG. 31 to FIG. 33, since the nickel film ME2*a* is provided under the gold film ME2*b* in addition to the presence of the insulating film PV under the metal film ME below the probe contact region PA, the external force (pressure) transmitted to the pad PD and the interlayer insulating film IL8 located thereunder at the time of the probe inspection can be further suppressed. Accordingly, in the case of the modification in FIG. 31 to FIG. 33, it is possible to more accurately suppress or prevent the external force (pressure) applied from the probe PRB to the probe contact region PA of the metal film ME at the time of the probe inspection from adversely affecting the pad PD and the interlayer insulating film IL8 located below the pad PD. For example, it is possible to suppress or prevent the deformation of the pad PD and the occurrence of the crack in the interlayer insulating film IL8 located under the pad PD more accurately. Hence, the reliability of the semiconductor device can be further enhanced.

Moreover, in the modification in FIG. 31, when the gold film ME2*b* is thinned too much, it is apprehended that nickel (Ni) in the nickel film ME2*a* may be diffused into the gold film ME2*b* and precipitated on a surface of the gold film ME2*b*. When Ni is precipitated on the surface of the gold film ME2*b*, the precipitated Ni is oxidized, so that it becomes difficult to bond the wire BW to the metal film ME. Therefore, preferably, a thickness T5 of the gold film ME2*b* is larger than a thickness T4 of the nickel film ME2*a* (that is, T5>T4). Moreover, more preferably, the thickness T5 of the gold film ME2*b* is 2 μm or more (that is T5≥2 μm). In this way, when the wire BW is bonded to the metal film ME (more specifically, the gold film ME2*b*), the wire can be bonded well.

Moreover, in order to achieve the function to suppress or block the transmission of the external force (pressure) from the probe PRB by the nickel film ME2*a*, preferably, the thickness T4 of the nickel film ME2*a* is 1 μm or more (that is, T4≥1 μm). In this way, it is possible to accurately suppress or prevent the external force (pressure) applied from the probe PRB to the probe contact region PA of the metal film ME at the time of the probe inspection from adversely affecting the pad PD and the interlayer insulating film IL8 located below the pad PD.

In the foregoing, the invention made by the inventors of the present invention has been concretely described based on the embodiments. However, it is needless to say that the present invention is not limited to the foregoing embodiments and various modifications can be made within the scope of the present invention.

What is claimed is:

1. A semiconductor device comprising:
a semiconductor substrate;
a first insulating film formed on the semiconductor substrate;
a pad formed on the first insulating film;
a second insulating film formed on the first insulating film so as to cover the pad;
an opening portion formed in the second insulating film so as to expose a first part of the pad while a second part of the pad is covered by the second insulating film; and
a metal film formed 1) on the first part of the pad exposed from the opening portion and 2) on a part of the second insulating film that overlaps the second part of the pad, the metal film being electrically connected to the pad,
wherein an upper surface of the metal film has:
a first region where a wire contacts the metal film, wherein the first region is disposed at a first position on the upper surface of the metal film that corresponds to the first part of the pad; and
a second region for bringing a probe into contact with the metal film, wherein the second region is disposed at a second position on the upper surface of the metal film that corresponds to the second part of the pad,
wherein the metal film that includes i) the first region where the wire contacts the metal film and ii) the second region for bringing the probe into contact with the metal film is formed on the pad such that the pad being a single piece extends beyond an entire perimeter of the metal film when viewed in plan view,
wherein, in plan view, an entirety of the first region where the wire contacts the metal film falls within the opening portion, and
wherein a thickness of the part of the second insulating film that overlaps the second part of the pad is larger than a thickness of the pad, the part of the second insulating film being located between the metal film and the pad.

2. The semiconductor device according to claim 1, wherein the second insulating film is an inorganic insulating film or a laminated film including an inorganic insulating film.

3. The semiconductor device according to claim 1, wherein the second insulating film is a silicon nitride film or a laminated film including a silicon nitride film.

4. The semiconductor device according to claim 1, wherein the second insulating film is a laminated film of a silicon nitride film and a silicon oxide film located on the silicon nitride film.

5. The semiconductor device according to claim 1,
wherein the metal film includes a gold film, and
wherein the pad is an aluminum pad.

6. The semiconductor device according to claim 5, wherein the metal film is comprised of a laminated film of a nickel film and the gold film located over the nickel film.

7. The semiconductor device according to claim 6, wherein the gold film is thicker than the nickel film.

8. The semiconductor device according to claim 6, wherein the gold film is an uppermost layer of the laminated film.

9. The semiconductor device according to claim 1,
wherein the first part of the pad is present below the first region, but the second insulating film is not present below the first region.

10. A method for manufacturing a semiconductor device, comprising the steps of:
(a) preparing a semiconductor substrate;
(b) forming a first insulating film on a main surface of the semiconductor substrate;
(c) forming a pad on the first insulating film;
(d) forming a second insulating film on the first insulating film so as to cover the pad;
(e) forming an opening portion in the second insulating film so as to expose a first part of the pad while a second part of the pad is covered by the second insulating film;
(f) forming a metal film on the first part of the pad exposed from the opening portion and on a part of the second insulating film that overlaps the second part of the pad;
(g) bringing a probe into contact with the metal film to perform a probe inspection; and
(h) bring a wire in contact with the metal film,
wherein the metal film includes:
a first region located at a first position on an upper surface of the metal film that corresponds to the first part of the pad; and
a second region located at a second position on the upper surface of the metal film that corresponds to the second part of the pad,
wherein, in the step (g), the probe is brought into contact with the second region of the metal film, and
wherein, in the step (h), the wire is in contact with the first region of the metal film,
wherein the metal film that includes i) the first region where the wire contacts the metal film and ii) the second region for bringing the probe into contact with the metal film is formed on the pad such that the pad being a single piece extends beyond an entire perimeter of the metal film when viewed in plan view,
wherein, in plan view, an entirety of the first region where the wire contacts the metal film falls within the opening portion, and
wherein a thickness of the part of the second insulating film that overlaps the second part of the pad is larger than a thickness of the pad, the part of the second insulating film being located between the metal film and the pad.

11. The method for manufacturing a semiconductor device according to claim 10, wherein the second insulating film is an inorganic insulating film or a laminated film including an inorganic insulating film.

12. The method for manufacturing a semiconductor device according to claim 10, wherein the second insulating film is a silicon nitride film or a laminated film including a silicon nitride film.

13. The method for manufacturing a semiconductor device according to claim 10, wherein the second insulating film is a laminated film of a silicon nitride film and a silicon oxide film located on the silicon nitride film.

14. The method for manufacturing a semiconductor device according to claim 10,
wherein the metal film includes a gold film, and
wherein the pad is an aluminum pad.

15. The method for manufacturing a semiconductor device according to claim 10, wherein the metal film is comprised of a laminated film of a nickel film and a gold film located over the nickel film.

16. The method for manufacturing a semiconductor device according to claim 15, wherein the gold film is thicker than the nickel film.

17. The method for manufacturing a semiconductor device according to claim 15, wherein the gold film is an uppermost layer of the laminated film.

18. The semiconductor device according to claim 1, wherein a thickness of the second region of the metal film is larger than the thickness of the second part of the pad.

* * * * *